(12) United States Patent
Yoshida et al.

(10) Patent No.: US 10,910,026 B2
(45) Date of Patent: Feb. 2, 2021

(54) CLOCK GENERATION CIRCUIT, SWITCHING POWER SUPPLY DEVICE, AND SEMICONDUCTOR DEVICE

(71) Applicant: Rohm Co., Ltd., Kyoto (JP)

(72) Inventors: Takehiro Yoshida, Kyoto (JP); Shun Fukushima, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 16/834,708

(22) Filed: Mar. 30, 2020

(65) Prior Publication Data

US 2020/0227101 A1  Jul. 16, 2020

Related U.S. Application Data

(63) Continuation of application No. 16/440,047, filed on Jun. 13, 2019, now Pat. No. 10,643,678.

(30) Foreign Application Priority Data

Jun. 15, 2018  (JP) ................ 2018-114197

(51) Int. Cl.
| | | |
|---|---|---|
| *H02M 1/00* | (2006.01) | |
| *H02M 3/335* | (2006.01) | |
| *G05F 1/00* | (2006.01) | |
| *G11C 7/22* | (2006.01) | |
| *G11C 16/30* | (2006.01) | |
| *G06F 1/04* | (2006.01) | |
| *H03L 7/081* | (2006.01) | |
| *H03L 7/14* | (2006.01) | |
| *G11C 16/12* | (2006.01) | |

(52) U.S. Cl.
CPC ............ *G11C 7/222* (2013.01); *G06F 1/04* (2013.01); *G11C 16/12* (2013.01); *G11C 16/30* (2013.01); *H03L 7/0814* (2013.01); *H03L 7/14* (2013.01)

(58) Field of Classification Search
None
See application file for complete search history.

(56) References Cited

U.S. PATENT DOCUMENTS

| | | | | |
|---|---|---|---|---|
| 6,285,226 | B1 * | 9/2001 | Nguyen | H03K 5/00006 327/122 |
| 6,647,081 | B2 * | 11/2003 | Butler | G06F 1/10 375/373 |
| 7,064,966 | B2 | 6/2006 | Yamada | |
| 7,839,194 | B2 * | 11/2010 | Chang | G06F 1/06 327/175 |

(Continued)

FOREIGN PATENT DOCUMENTS

JP     2006-287736     10/2006

*Primary Examiner* — Kenneth B Wells
(74) *Attorney, Agent, or Firm* — Fish & Richardson P.C.

(57) ABSTRACT

A clock generation circuit, which generates an output clock using an external clock as a target clock, includes a circuit arranged to change the output clock to high level in synchronization with an up edge of the target clock, circuits arranged to generate first and second ramp voltages with a period of interval between neighboring up edges of the target clock, and a circuit arranged to hold a comparison voltage corresponding to a second ramp voltage when an up edge of the target clock occurs. The level of the output clock is changed from high level to low level based on a comparison result between the first ramp voltage and the comparison voltage.

7 Claims, 17 Drawing Sheets

(56) References Cited

U.S. PATENT DOCUMENTS

| | | |
|---|---|---|
| 8,188,798 B1 | 5/2012 | Leung |
| 8,912,775 B2 | 12/2014 | Feldtkeller |
| RE46,419 E | 5/2017 | Isham |
| 10,643,678 B2 * | 5/2020 | Yoshida .................... G06F 1/04 |

* cited by examiner

FIG.1
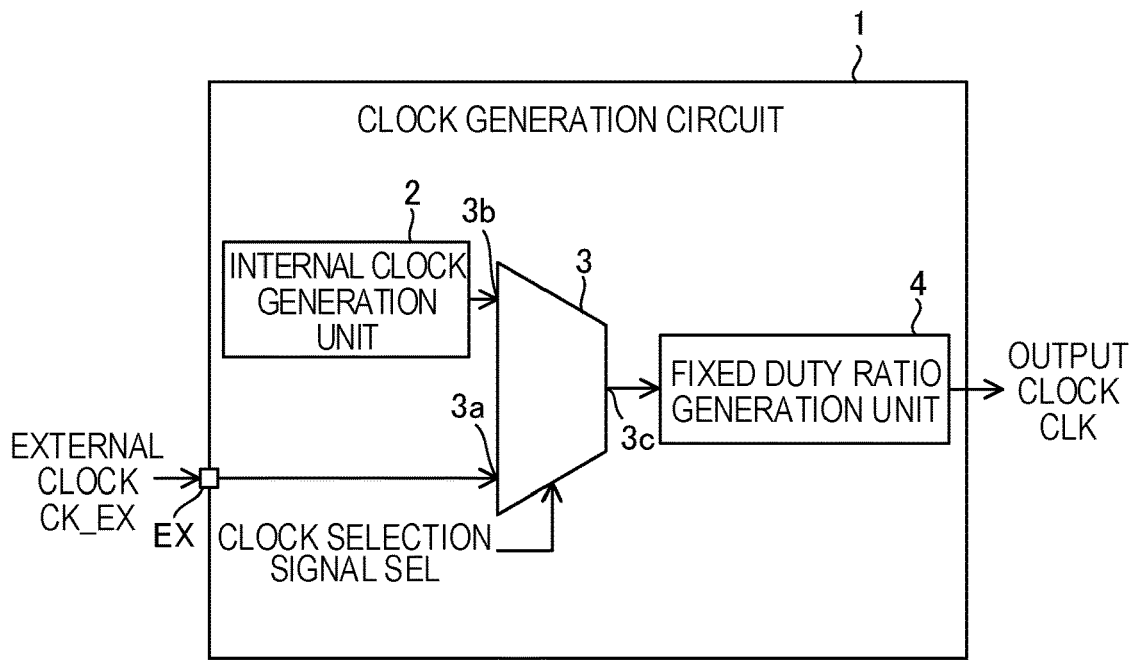
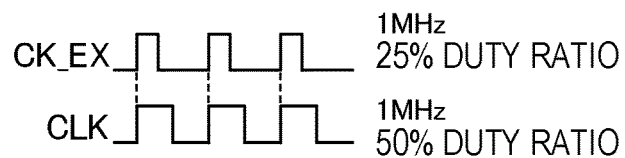
FIG.2A
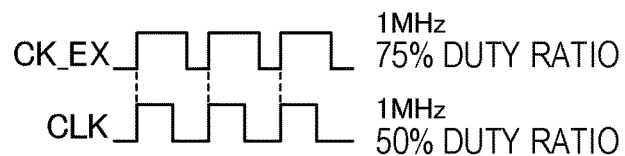
FIG.2B
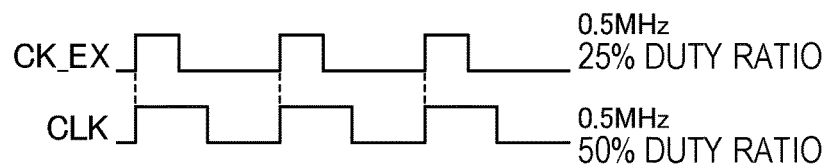
FIG.2C
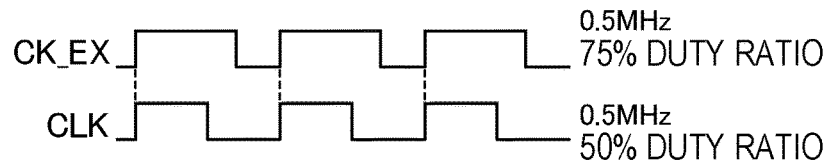
FIG.2D

RERATED ART

CLOCK GENERATION CIRCUIT, SWITCHING POWER SUPPLY DEVICE, AND SEMICONDUCTOR DEVICE

CROSS-REFERENCE TO RELATED APPLICATIONS

This application is a continuation of U.S. patent application Ser. No. 16/440,047, filed Jun. 13, 2019, now U.S. Pat. No. 10,643,678 which claims priority under 35 U.S.C. § 119(a) on Patent Application No. 2018-114197 filed in Japan on Jun. 15, 2018, the entire contents of which are hereby incorporated by reference.

BACKGROUND OF THE INVENTION

Field of the Invention

The present invention relates to a clock generation circuit, a switching power supply device, and a semiconductor device.

Description of Related Art

FIG. 20 is a structural block diagram of a conventional clock generation circuit 901. The clock generation circuit 901 includes an internal clock generation unit 902 and a phase locked loop (PLL) circuit 903. Further, when an external clock is supplied to the clock generation circuit 901, the PLL circuit 903 generates and outputs an output clock based on the external clock. When the external clock is not supplied, the PLL circuit 903 generates and outputs an output clock based on the internal clock from the internal clock generation unit 902. The output clock is used, for example, as a switching clock in the switching power supply device.

Prior Art Document: Patent Document 1 (JP-A-2006-287736)

According to structural circumstances of an electronic apparatus equipped with the clock generation circuit 901, a duty ratio of the external clock can have various values, but it is desired that the duty ratio of the output clock is always fixed to a desired value regardless of the duty ratio of the external clock in many cases. For instance, a multi-channel output type switching power supply device may be required to perform switching drive in a state where phases of output stage circuits for a plurality of channels are shifted from each other, and in order to satisfy the requirement, it is necessary to fix the duty ratio of the output clock (the reason will also be clarified in the description given later). A multiphase DC/DC converter and the like have similar circumstances.

By using the PLL circuit 903 like the clock generation circuit 901 illustrated in FIG. 20, the duty ratio of the output clock can be fixed. However, a circuit scale of the PLL circuit is relatively large, and hence the clock generation circuit becomes large when the PLL circuit is used. It is useful if the duty ratio of the output clock can be set to a desired value without using the PLL circuit.

SUMMARY OF THE INVENTION

An object of the present invention is to provide a clock generation circuit capable of generating an output clock of a desired duty ratio with a small circuit scale, and a switching power supply device and a semiconductor device that are related to the clock generation circuit.

A clock generation circuit according to the present invention is a clock generation circuit capable of generating an output clock from a target clock by using an external clock as the target clock when the external clock is input. The clock generation circuit includes a clock output circuit arranged to change level of the output clock from a first level to a second level in synchronization with a predetermined level change of the target clock, a first ramp voltage generation circuit arranged to generate a first ramp voltage whose voltage value changes with a period of interval between neighboring predetermined level changes of the target clock, a second ramp voltage generation circuit arranged to generate a second ramp voltage whose voltage value changes with a period of the interval, a comparison voltage holding circuit arranged to hold a comparison voltage corresponding to the second ramp voltage when the predetermined level change occurs, and a comparator arranged to compare the first ramp voltage with the comparison voltage. The clock output circuit changes the level of the output clock from the second level to the first level based on a comparison result of the comparator.

Specifically, for example, in the clock generation circuit described above, after the predetermined level change of the target clock, in response to a signal output from the comparator indicating that high and low relationship between the first ramp voltage and the comparison voltage is reversed, the clock output circuit preferably changes the level of the output clock from the second level to the first level.

In addition, specifically, for example, the following structure is preferred. In the clock generation circuit described above, the first ramp voltage generation circuit includes a first capacitor and a first constant current circuit arranged to supply a first constant current to the first capacitor. In each period, when supplied with the first constant current, the first ramp voltage generation circuit changes terminal voltage of the first capacitor from a predetermined first initial voltage so as to generate the first ramp voltage from the terminal voltage of the first capacitor. The second ramp voltage generation circuit includes a second capacitor and a second constant current circuit arranged to supply a second constant current to the second capacitor. In each period, when supplied with the second constant current, the second ramp voltage generation circuit changes terminal voltage of the second capacitor from a predetermined second initial voltage so as to generate the second ramp voltage from the terminal voltage of the second capacitor. The comparison voltage holding circuit includes a third capacitor and holds terminal voltage of the third capacitor as the comparison voltage in each period. A switch is disposed between the second capacitor and the third capacitor, and a part of stored charge of the second capacitor is supplied to the third capacitor via the switch in response to the predetermined level change of the target clock, resulting in generation of the comparison voltage in the third capacitor.

Further, specifically, for example, the following structure is preferred. The clock generation circuit further includes a first pulse output circuit arranged to output a first pulse signal in response to the predetermined level change of the target clock, and a second pulse output circuit arranged to output a second pulse signal when receiving from the comparator a signal indicating that high and low relationship between the first ramp voltage and the comparison voltage is reversed, after the predetermined level change of the target clock. The first ramp voltage generation circuit includes a first capacitor discharge circuit capable of discharging the first capacitor, and the comparison voltage holding circuit includes a third capacitor discharge circuit capable of discharging the third capacitor. In response to the output of the first pulse signal, the first capacitor discharge circuit discharges the first capacitor, and the switch is turned on so that the second capacitor and the third capacitor are connected in parallel via the switch. In response to the output of the second pulse signal, the third capacitor discharge circuit discharges the third capacitor.

In addition, for example, in the clock generation circuit described above, it is preferred that current values of the first constant current and the second constant current be proportional to each other.

In addition, for example, in the clock generation circuit described above, it is preferred that capacitance values of the first capacitor, the second capacitor, and the third capacitor be proportional to each other.

In addition, for example, the following structure is preferred. The clock generation circuit further includes an internal clock generation unit arranged to generate an internal clock, and when the external clock is not supplied, the output clock can be generated using the internal clock as the target clock.

In this case, for example, in the clock generation circuit described above, the internal clock generation unit preferably compares the first ramp voltage with a predetermined reference voltage so as to generate a binary signal indicating the comparison result as the internal clock.

A switching power supply device according to the present invention includes the clock generation circuit described above and performs switching of an input voltage using the output clock generated by the clock generation circuit so as to generate an output voltage.

Specifically, for example, the switching power supply device preferably includes a plurality of output stage circuits arranged to perform switching of the input voltage and generates one or more output voltages using the plurality of output stage circuits so as to drive the plurality of output stage circuits at different phases using the output clock.

A semiconductor device according to the present invention is a semiconductor device forming the switching power supply device and is constituted of an integrated circuit.

According to the present invention, it is possible to provide a clock generation circuit capable of generating an output clock of a desired duty ratio with a small circuit scale, and a switching power supply device and a semiconductor device that are related to the clock generation circuit.

BRIEF DESCRIPTION OF THE DRAWINGS

FIG. 1 is a schematic structural diagram of a clock generation circuit according to an embodiment of the present invention.

FIGS. 2A to 2D are charts showing relationships between an external clock and an output clock of the clock generation circuit according to the embodiment of the present invention.

DETAILED DESCRIPTION OF THE PREFERRED EMBODIMENTS

Figure 3:
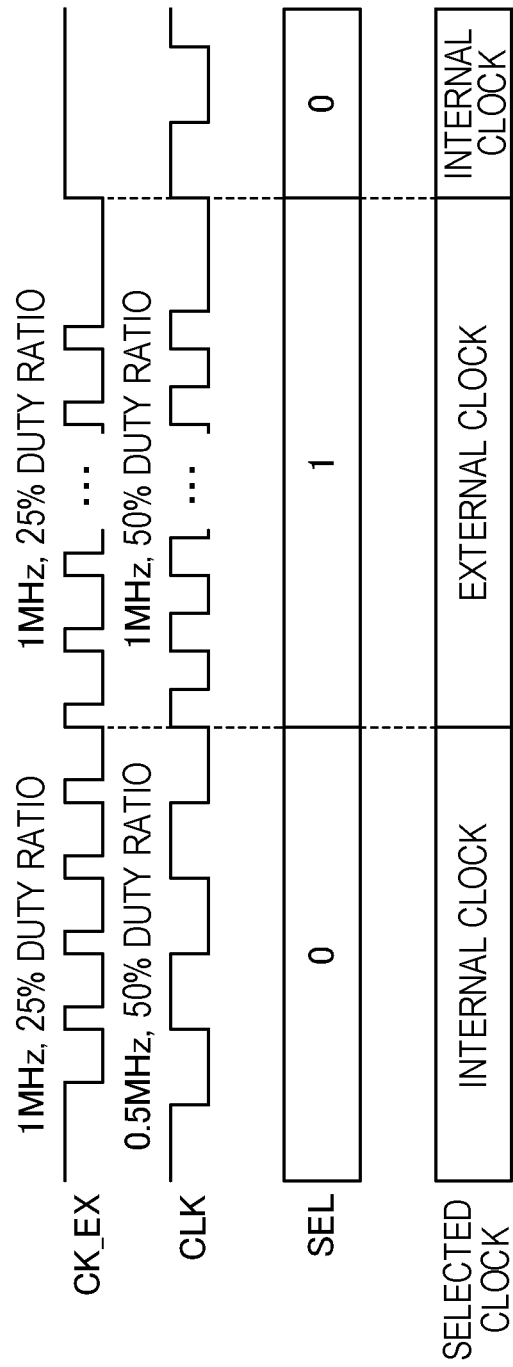
FIG. 3 is a chart showing a relationship among the external clock, the output clock, and a clock selection signal according to the embodiment of the present invention.

Hereinafter, examples of embodiment of the present invention are specifically described with reference to the drawings. In the drawings that are referred to, the same part is denoted by the same numeral or symbol so that overlapping description of the same part is omitted as a rule. Note that in this specification, for simple description, name of information, signal, physical quantity, member, or the like may be omitted or abbreviated by using numeral or symbol of the information, signal, physical quantity, member, or the like. For instance, an external clock input terminal denoted by "EX" in later description may be referred to as an external clock input terminal EX or may be abbreviated as an input terminal EX, both of which indicate the same thing.

First, some technical terms used in this embodiment are defined below.

A ground means a conductive part at a reference potential of 0 V (zero volts) or the reference potential itself. In each embodiment, a voltage without a specific reference indicates a potential with respect to the ground.

A line has the same meaning as wiring.

A level means a potential level. Regarding an arbitrary signal or voltage, high level means a potential higher than low level.

In an arbitrary signal or voltage, switching from low level to high level is referred to as an up edge, and timing of switching from low level to high level is referred to as up edge timing. Similarly, in an arbitrary signal or voltage, switching from high level to low level is referred to as a down edge, and timing of switching from high level to low level is referred to as down edge timing.

An arbitrary clock such as an external clock, an internal clock, or an output clock described later is a rectangular wave signal that periodically becomes high level and low level. A ratio of a high level length to one period length in each period of an arbitrary clock is referred to as a duty ratio.

In an arbitrary transistor constituted as a field-effect transistor (FET), ON state means a conductive state between drain and source of the transistor, while OFF state means a non-conductive state (cutoff state) between drain and source of the transistor.

An arbitrary switch is constituted of one or more field-effect transistors (FET). When a certain switch is in ON state, the terminals of the switch are conductive. In contrast, when a certain switch is in OFF state, the terminals of the switch are non-conductive. In the following description, for an arbitrary transistor or switch, ON state and OFF state may be simply referred to as ON and OFF, respectively.

In an arbitrary transistor or switch, switching from OFF state to ON state is referred to as turning on, while switching from ON state to OFF state is referred to as turning off.

FIG. 1 is a schematic structural diagram of a clock generation circuit 1 according to the embodiment of the present invention. The clock generation circuit 1 is an oscillator arranged to generate an output clock having a fixed duty ratio and includes an internal clock generation unit 2, a selection circuit 3, and a fixed duty ratio generation unit 4. The clock generation circuit 1 has also an external clock input terminal EX to receive an input of an external clock. In the following description, including the drawings to be referred to, the external clock may be denoted by symbol "CK_EX", and the output clock may be denoted by symbol "CLK".

FIGS. 2A to 2D shows examples of relationships between the external clock CK_EX and the output clock CLK when the external clock CK_EX is input to the input terminal EX. When the external clock CK_EX is input to the input terminal EX, the clock generation circuit 1 generates and outputs the output clock CLK, which has the same frequency as the external clock CK_EX and has a fixed duty ratio without depending on the duty ratio of the external clock CK_EX. The fixed duty ratio is a duty ratio that is fixedly determined in advance by the fixed duty ratio generation unit 4. When the external clock CK_EX is not input to the input terminal EX, the clock generation circuit 1 generates and outputs the output clock CLK that is generated by the internal clock generation unit 2 and has a fixed duty ratio.

In FIGS. 2A to 2D, it is supposed that the external clock CK_EX having a frequency of 1 MHz (megahertz) or 0.5 MHz and a duty ratio of 25% or 75% is input to the input terminal EX, and that the fixed duty ratio is 50%. Under this supposition, when the external clock CK_EX having a frequency of 1 MHz and a duty ratio of 25% or 75% is input to the input terminal EX, the clock generation circuit 1 generates and outputs the output clock CLK having a frequency of 1 MHz and a duty ratio of 50%. When the external clock CK_EX having a frequency of 0.5 MHz and a duty ratio of 25% or 75% is input to the input terminal EX, the clock generation circuit 1 generates and outputs the output clock CLK having a frequency of 0.5 MHz and a duty ratio of 50%.

Although it is supposed that the fixed duty ratio is 50% in FIGS. 2A to 2D, but the fixed duty ratio may be set to any value larger than 0% and smaller than 100%. In addition, the duty ratio of the external clock CK_EX is also any value larger than 0% and smaller than 100%. Further, the frequency of the external clock CK_EX may be other than 1 MHz or 0.5 MHz. Practically, however, in consideration of response speed or the like of each circuit in the clock generation circuit 1, the frequency of the external clock CK_EX is limited within a predetermined frequency range.

As a structure, out of two input terminals 3a and 3b provided to the selection circuit 3, the input terminal 3a is connected to the input terminal EX, and the input terminal 3b is supplied with the internal clock generated by the internal clock generation unit 2. A clock selection signal, which is generated by a selection signal generation circuit (not shown) in the clock generation circuit 1, is input to the selection circuit 3, and the selection circuit 3 selects one of the clocks supplied to the input terminals 3a and 3b in accordance with the clock selection signal, and outputs the selected clock from its output terminal 3c. In the following description, including the drawings to be referred to, the clock selection signal may be denoted by symbol "SEL". The fixed duty ratio generation unit 4 acts to generate the output clock CLK having the same frequency as the clock output from the selection circuit 3 and the fixed duty ratio. Note that FIG. 1 illustrates a simplified structure of the clock generation circuit 1, and the clock generation circuit 1 actually includes a circuit arranged to actually output the output clock CLK in cooperation with the fixed duty ratio generation unit 4 (details will be described later). The clock selection signal SEL is a binary signal having value "1" or "0". When the clock selection signal SEL has value "1", the external clock CK_EX supplied to the input terminal 3a via the input terminal EX is selected. When the clock selection signal SEL has value "0", the internal clock supplied to the input terminal 3b is selected.

Basically, the clock selection signal SEL has value "1" when the external clock CK_EX is input to the input terminal EX, while the clock selection signal SEL has value "0" when the external clock CK_EX is not input to the input terminal EX. In the following description, an interval in which the external clock CK_EX is input to the input terminal EX is referred to as an input interval of the external clock CK_EX, and an interval in which the external clock CK_EX is not input to the input terminal EX is referred to as a non-input interval of the external clock CK_EX (although symbol "CK_EX" may be omitted).

More specifically, as illustrated in FIG. 3, just after the clock generation circuit 1 is activated, the clock selection signal SEL has value "0", and after that, the clock selection signal SEL is maintained at value "0" until the external clock CK_EX is input to the input terminal EX. During the interval in which the selection signal SEL has value "0", the output clock CLK is generated and output based on the internal clock. Further, the non-input interval of the external clock CK_EX is changed to the input interval of the external clock CK_EX, and in the input interval of the external clock CK_EX, when the external clock CK_EX of four periods is input, the clock selection signal SEL is changed from "0" to "1", so that generation and output of the output clock CLK based on the external clock CK_EX is started. After that, if the input of the external clock CK_EX to the input terminal EX is stopped for a predetermined time or longer, the clock selection signal SEL is changed from "1" to "0". Note that in the example of FIG. 3, it is supposed that the external clock CK_EX has a frequency of 1 MHz and a duty ratio of 25%, and that the internal clock has a frequency of 0.5 MHz (the duty ratio of the internal clock is arbitrary), and that the fixed duty ratio is determined to be 50%.

Figure 4:
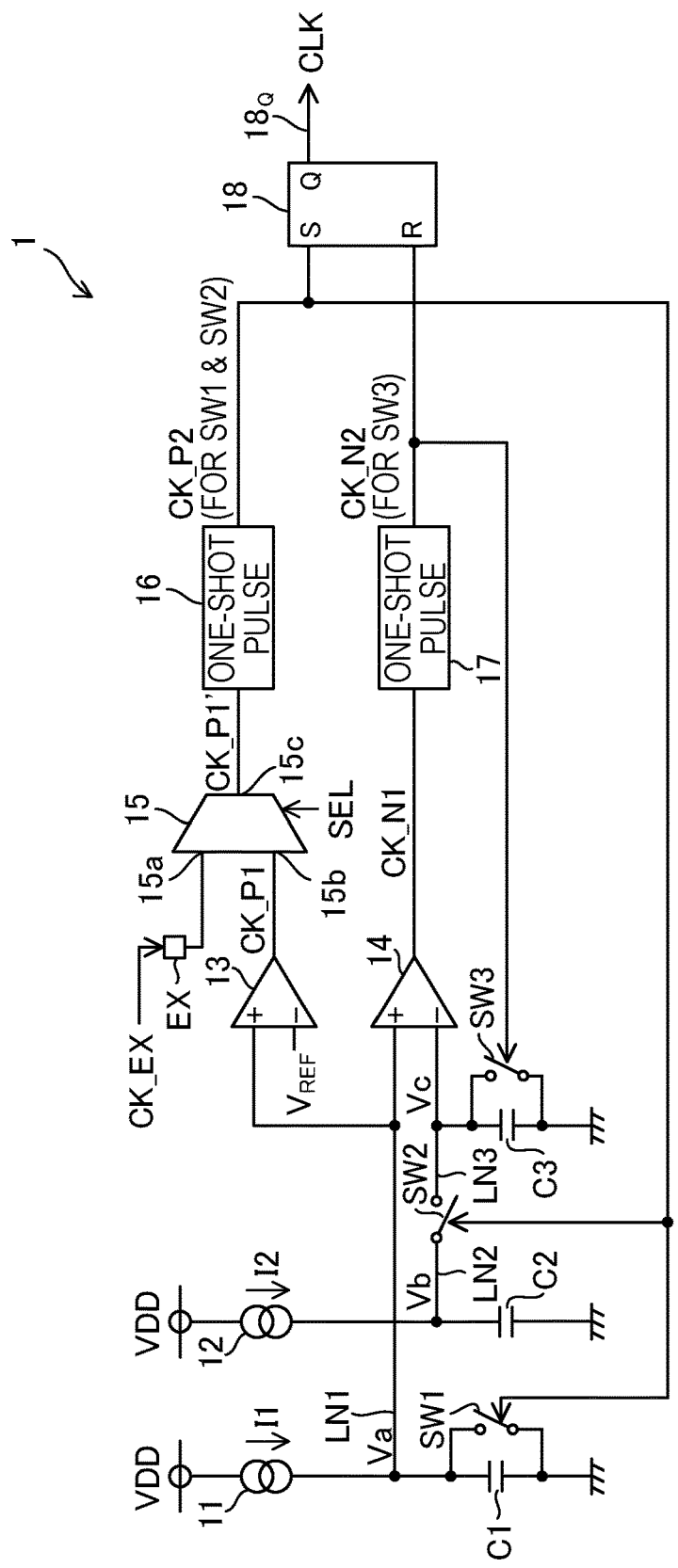
FIG. 4 is a detailed structural diagram of the clock generation circuit according to the embodiment of the present invention.

FIG. 4 illustrates a detailed circuit diagram of the clock generation circuit 1. The clock generation circuit 1 includes capacitors C1 to C3, switches SW1 to SW3, constant current circuits 11 and 12, comparators 13 and 14, a selection circuit 15, one-shot pulse circuits 16 and 17, and an RS flip-flop 18.

The constant current circuit 11 generates a constant current I1 based on a power supply voltage VDD and supplies the constant current I1 to a line LN1. The constant current circuit I2 generates a constant current I2 based on the power supply voltage VDD and supplies the constant current I2 to a line LN2. The constant currents I1 and I2 have positive predetermined current values. The power supply voltage VDD and a reference voltage $V_{REF}$ described later are generated by a regulator circuit (not shown) based on a DC voltage supplied from an external device (not shown) of the clock generation circuit 1. The regulator circuit may be disposed in the clock generation circuit 1 or may be disposed in a device including the clock generation circuit 1 (e.g. a switching power supply device described later).

A first terminal of the capacitor C1 is connected to the line LN1, and a second terminal of the capacitor C1 is connected to the ground. In addition, a first terminal and a second terminal of the switch SW1 are connected to the first terminal and the second terminal of the capacitor C1, respectively. Therefore, when the switch SW1 is in ON state, the terminals of the capacitor C1 are short circuited so that a voltage between terminals of the capacitor C1 becomes zero volts. When the switch SW1 is in OFF state, the charge supplied by the constant current I1 is stored in the capacitor C1 so that the voltage at the line LN1 is monotonously increased.

A first terminal of the capacitor C2 is connected to the line LN2, and a second terminal of the capacitor C2 is connected to the ground. A first terminal of the capacitor C3 is connected to a line LN3, and a second terminal of the capacitor C3 is connected to the ground. A first terminal of the switch SW2 is connected to the line LN2 (therefore is connected to the first terminal of the capacitor C2), and a second terminal of the switch SW2 is connected to the line LN3 (therefore is connected to the first terminal of the capacitor C3). In addition, a first terminal and a second terminal of the switch SW3 are connected to the first terminal and the second terminal of the capacitor C3, respectively.

Therefore, during an interval in which the switch SW2 is in OFF state, the charge supplied by the constant current I2 is stored in the capacitor C2 so that the voltage at the line LN2 is monotonously increased. When the switch SW3 is in ON state, the terminals of the capacitor C3 are short circuited so that the voltage between terminals of the capacitor C3 becomes zero volts. When the switch SW2 is in ON state, the lines LN2 and LN3 are connected via the switch SW2, and the capacitors C2 and C3 are connected in parallel. The switch SW2 is periodically turned on in the operation of the clock generation circuit 1, but a time length during which the switch SW2 is in ON state is sufficiently short. Therefore, in the following description, charging of the capacitor C3 by the constant current I2 when the switch SW2 is in ON state is ignored. Note that the second terminals of the capacitors C1 to C3 may be connected to a potential terminal having a DC potential other than zero volts.

In the following description, voltages of the lines LN1, LN2, and LN3 are denoted by Va, Vb, and Vc, respectively. The voltages Va and Vb are first and second ramp voltages, which increase at predetermined gradients along with increases of stored charges in the capacitors C1 and C2 by the constant currents I1 and I2 when the switches SW1 and SW2 are in OFF state.

The comparator 13 compares the voltage Va with the predetermined reference voltage $V_{REF}$ and outputs a signal CK_P1 as a binary signal indicating the comparison result. The reference voltage $V_{REF}$ has a predetermined positive DC voltage value. Specifically, a non-inverting input terminal of the comparator 13 is connected to the line LN1 and is supplied with the voltage Va, while an inverting input terminal of the comparator 13 is supplied with the reference voltage $V_{REF}$. Therefore the comparator 13 outputs the signal CK_P1 at high level when the voltage Va is higher than the reference voltage $V_{REF}$, and it outputs the signal CK_P1 at low level when the voltage Va is lower than the reference voltage $V_{REF}$. Although the level of the signal CK_P1 can be unstable when the voltage Va is just equal to the reference voltage $V_{REF}$, it is supposed that the level of the signal CK_P1 is at high level in that case.

The comparator 14 compares the voltage Va with the voltage Vc and outputs a signal CK_N1 as a binary signal indicating the comparison result. Specifically, a non-inverting input terminal of the comparator 14 is connected to the line LN1 and is supplied with the voltage Va, while an inverting input terminal of the comparator 14 is connected to the line LN3 and is supplied with the voltage Vc. Therefore the comparator 14 outputs the signal CK_N1 at high level when the voltage Va is higher than the voltage Vc, and it outputs the signal CK_N1 at low level when the voltage Va is lower than the voltage Vc. Although the level of the signal CK_N1 can be unstable when the voltage Va is just equal to the voltage Vc, it is supposed that the level of the signal CK_N1 is at high level in that case.

The selection circuit 15 is constituted of a two-input multiplexer having an input terminal 15a, an input terminal 15b, and an output terminal 15c. The selection circuit 15 corresponds to the selection circuit 3 of FIG. 1. The input terminal 15a, the input terminal 15b, and the output terminal 15c correspond to the input terminal 3a, the input terminal 3b, and the output terminal 3c of FIG. 1, respectively. The input terminal 15a is connected to the external clock input terminal EX. Therefore, when the external clock CK_EX is supplied to the external clock input terminal EX, the external clock CK_EX is input to the input terminal 15a. The input terminal 15b is supplied with the output signal CK_P1 of the comparator 13. The output signal CK_P1 of the comparator 13 corresponds to the internal clock. When the clock selection signal SEL has value "1", the selection circuit 15 selects a signal supplied to the input terminal 15a and outputs it from the output terminal 15c, i.e. outputs the external clock CK_EX, which is supplied to the input terminal 15a via the input terminal EX, from the output terminal 15c. On the contrary, when the clock selection signal SEL has value "0", the selection circuit 15 selects a signal supplied to the input terminal 15b and outputs it from the output terminal 15c, i.e. outputs the internal clock as the signal CK_P1 from the output terminal 15c. The condition under which the clock selection signal SEL has value "0" or value "1" is as described above.

Figure 5A:
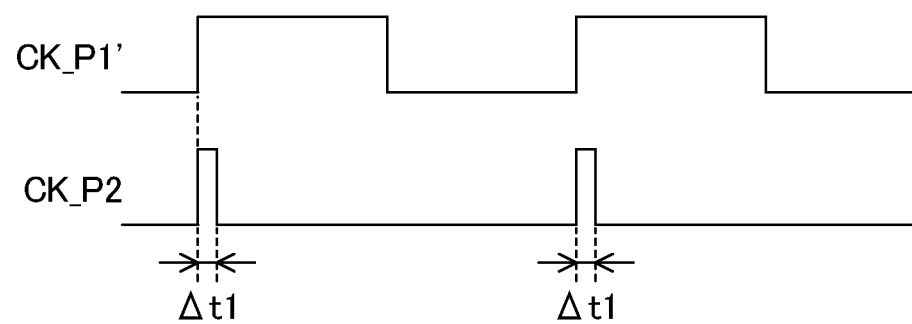
FIGS. 5A and 5B are charts showing some signal waveforms in the circuit illustrated in FIG. 4 according to the embodiment of the present invention.

The one-shot pulse circuit 16 outputs a signal CK_P2 based on an output signal CK_P1' of the selection circuit 15. The signal CK_P2 is a binary signal having low level or high level and basically has low level. As illustrated in FIG. 5A, when an up edge occurs in the output signal CK_P1' of the selection circuit 15, the one-shot pulse circuit 16 generates a pulse signal on the signal CK_P2, and the pulse signal is at high level during a predetermined micro time Δt1 after the up edge timing. Except an output interval of this pulse signal, the signal CK_P2 is maintained at low level. The micro time Δt1 is sufficiently short compared with a period of the internal clock and a period of the external clock CK_EX.

Figure 5B:
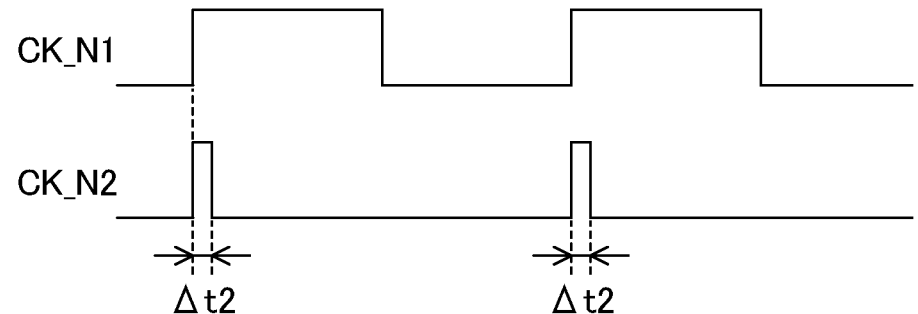

The one-shot pulse circuit 17 outputs a signal CK_N2 based on the output signal CK_N1 of the comparator 14. The signal CK_N2 is a binary signal having low level or high level and basically has low level. As illustrated in FIG. 5B, when an up edge occurs in the output signal CK_N1 of the comparator 14, the one-shot pulse circuit 17 generates a pulse signal on the signal CK_N2, and the pulse signal is at high level during a predetermined micro time Δt2 from the up edge timing. Except an output interval of this pulse signal, the signal CK_N2 is maintained at low level. The micro time Δt2 is sufficiently short compared with a period of the internal clock and a period of the external clock CK_EX. The lengths of the micro times Δt1 and Δt2 are equal to each other, but may be different from each other.

The RS flip-flop 18 (hereinafter referred to as FF 18) has a set terminal (S), a reset terminal (R), and an output terminal (Q), and the signals CK_P2 and CK_N2 are input to the set terminal and the reset terminal, respectively. An output signal $18_Q$ from the output terminal (Q) of the FF 18 corresponds to the output clock CLK of the clock generation circuit 1.

In the signals CK_P2, CK_N2, and $18_Q$ the high level is assigned with a logical value "1", and the low level is assigned with a logical value "0". When logical values of the signals CK_P2 and CK_N2 are "1" and "0", respectively, the FF 18 latches the logical value "1" and sets the output signal $18_Q$ to high level in response to the latched logical value "1". When the logical values of the signals CK_P2 and CK_N2 are "0" and "1", respectively, the FF 18 latches the logical value "0" and sets the output signal $18_Q$ to low level in response to the latched logical value "0". When the logical values of the signals CK_P2 and CK_N2 are both "0", the FF 18 sets a level corresponding to the latched logical value as the level of the output signal $18_Q$. In an actual operation, the up edge of the signal CK_P2 and the up edge of the signal CK_N2 occur alternately. The up edge of the output clock CLK occurs in synchronization with the up edge of the signal CK_P2, and the down edge of the output clock CLK occurs in synchronization with the up edge of the signal CK_N2.

On and off of the switches SW1 and SW2 are controlled in accordance with the signal CK_P2. Specifically, when the signal CK_P2 is at high level, the switches SW1 and SW2 are in ON state, while when the signal CK_P2 is at low level, the switches SW1 and SW2 are in OFF state. On and off of the switch SW3 are controlled in accordance with the signal CK_N2. Specifically, when the signal CK_N2 is at high level, the switch SW3 is in ON state, while when the signal CK_N2 is at low level, the switch SW3 is in OFF state.

The above description in this embodiment is referred to as a basic example for convenience sake. Operation examples, application examples, and the like of the clock generation circuit 1 based on the structure and operation described above are described in a plurality of examples below. The above description in the basic example is applied to each example below unless otherwise noted and unless any contradiction occurs, and description in each example has a priority over the above description in the basic example if there is a contradiction between them. As long as there is no contradiction, description in an arbitrary example among the examples described below can be applied to another arbitrary example (i.e. arbitrary two or more examples among the examples can be combined).

First Example

Figure 6:
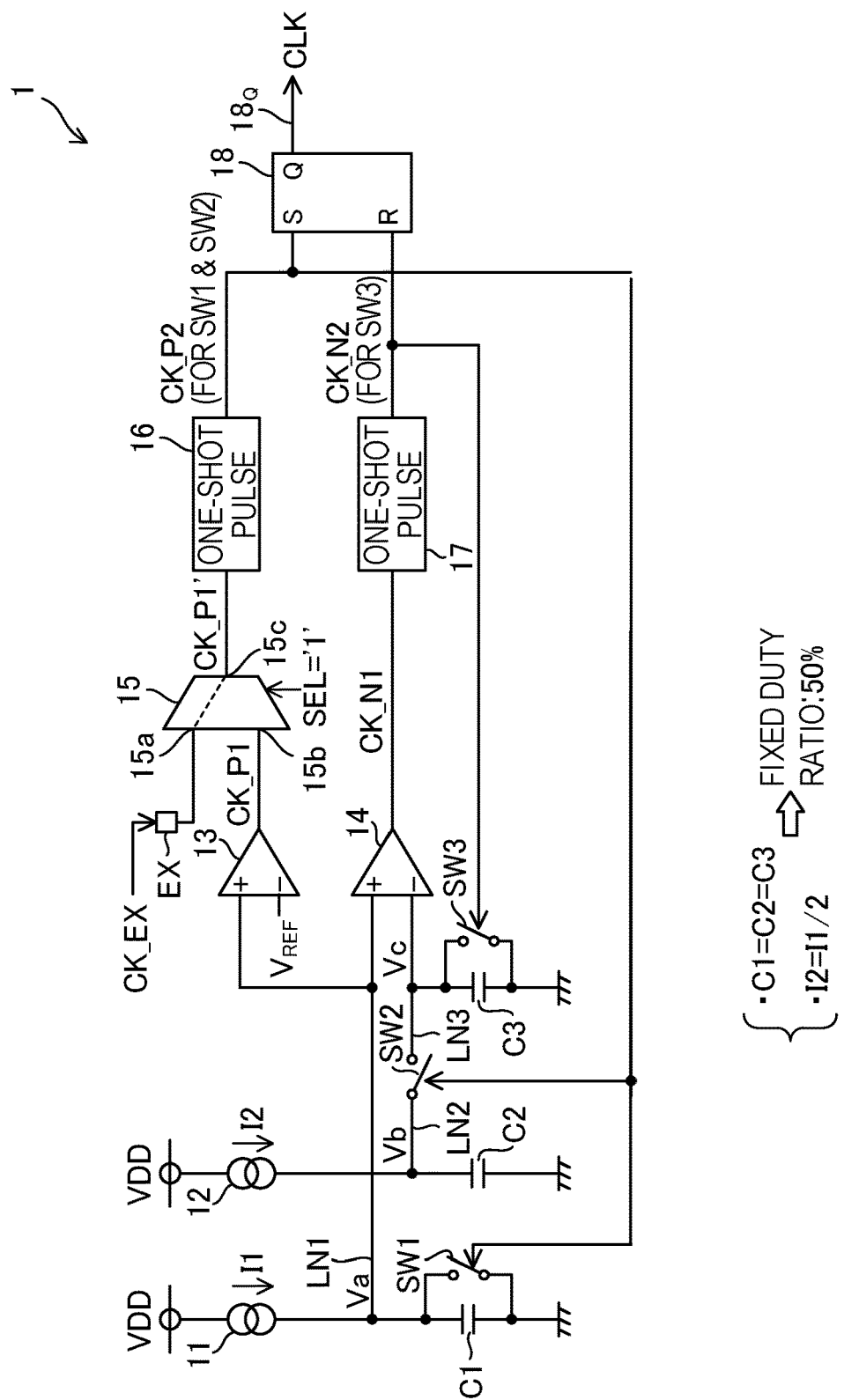
FIG. 6 is a diagram showing operating conditions of the clock generation circuit assumed for a first example of the present invention.

A first example is described below. In the first example, as illustrated in FIG. 6, it is supposed that the external clock CK_EX is input to the input terminal EX, and that the selection signal SEL is "1". In addition, it is supposed that capacitance values of the capacitors C1, C2, and C3 are the same, and that the value of the constant current I2 is ½ of the value of the constant current I1. In this case, the fixed duty ratio is set to 50% (the reason will be apparent from the following description).

Figure 7:
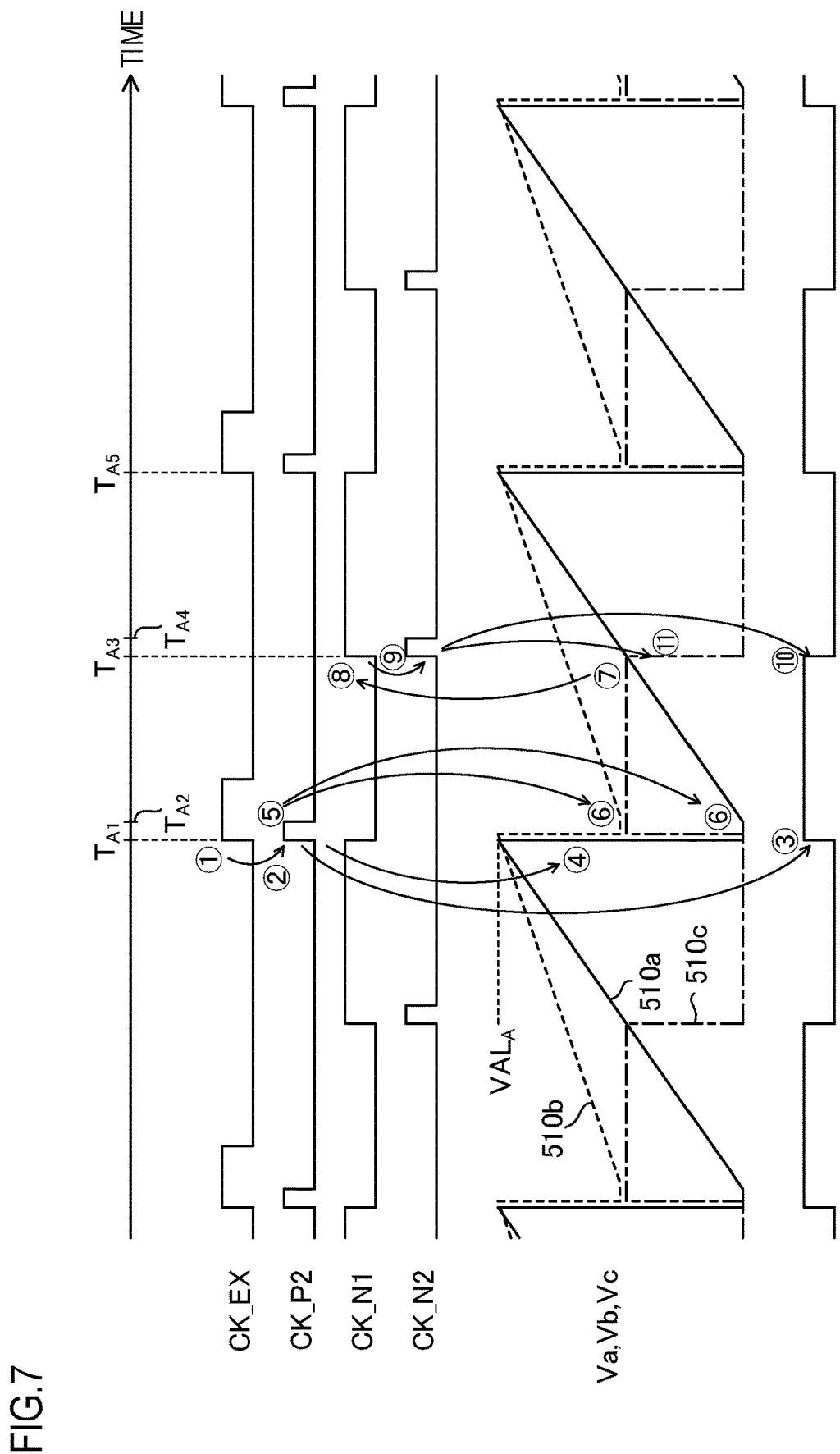
FIG. 7 is a timing chart of the clock generation circuit according to the first example of the present invention.

FIG. 7 is a signal waveform diagram under supposition of the first example. A certain period of the external clock CK_EX is noted, and the up edge timing of the external clock CK_EX is regarded as a starting point, for describing the operation of the clock generation circuit 1. In FIG. 7, a solid polygonal line 510a, a broken polygonal line 510b, and a dot-dashed polygonal line 510c indicate waveforms of the voltages Va, Vb, and Vc, respectively.

At timing $T_{A1}$, an up edge (i.e. switch from low level to high level) occurs in the external clock CK_EX. Then in synchronization with the up edge, the one-shot pulse circuit 16 generates a pulse signal on the signal CK_P2 so that an up edge occurs in the signal CK_P2. Further, in synchronization with the up edge of the signal CK_P2, an up edge is generated also in the output clock CLK by the FF 18 (see circled numerals 1 to 3 in FIG. 7).

In addition, just before occurrence of the up edge of the signal CK_P2, voltage values of the voltages Va and Vb have positive predetermined voltage value $VAL_A$, and the voltage Vc is zero. Therefore the signal CK_N1 is at high level, and the signal CK_N2 is at low level. The voltage value $VAL_A$ is determined depending on the period of the external clock CK_EX, a value of the constant current I1, and the like. The timing $T_{A1}$ is regarded as a starting point, and the output pulse signal of the one-shot pulse circuit 16 makes the signal CK_P2 be at high level for the micro time Δt1 (see FIG. 5A). Therefore, the switches SW1 and SW2 are in ON state during a high level period of the signal CK_P2. As a result, just after the timing $T_{A1}$ (substantially at timing $T_{A1}$), stored charge in the capacitor C1 is discharged via the switch SW1 so that the voltage Va is decreased to zero, while stored charge in the capacitor C2 is divided between the capacitors C2 and C3 via the switch SW2. Thus, the voltage values of the voltages Vb and Vc are both "$VAL_A/2$" (see circled numeral 4 in FIG. 7). As a result, when the comparator 14 works, a down edge occurs in the signal CK_N1. Note that in this timing, the signal CK_N2 is at low level, and hence the switch SW3 is in OFF state.

After that, the signal CK_P2 returns to low level at timing $T_{A2}$, and then the switches SW1 and SW2 are turned off. Therefore the constant current I1 charges the capacitor C1 so that the voltage Va starts to increase from zero volts as a first initial voltage, and the constant current I2 charges the capacitor C2 so that the voltage Vb starts to increase from "$VAL_A/2$" as a second initial voltage (see circled numerals 5 and 6 in FIG. 7). It is supposed that "I2=I1/2" holds, and hence the increase gradient of the voltage Vb is ½ of the increase gradient of the voltage Va. Note that it is supposed that the micro time Δt1 is sufficiently short so that charging of the capacitors C2 and C3 by the constant current I2 during the interval in which the signal CK_P2 is at high level is omitted. Then, after timing $T_{A2}$, the capacitor C3 holds the voltage Vc at a value of "VAL$_A$/2". This holding is maintained until timing T$_{A3}$ described later.

After timing T$_{A2}$ until timing T$_{A3}$, "Va<Vc" holds, and the signal CK_N1 is at low level. The increase of voltage Va from timing T$_{A2}$ as a starting point causes a value of the voltage Va to reach the voltage value "VAL$_A$/2" held by the capacitor C3 at timing T$_{A3}$, and the comparator 14 operates to generate an up edge in the signal CK_N1 (see circled numerals 7 and 8 in FIG. 7). In synchronization with the up edge of the signal CK_N1, the one-shot pulse circuit 17 generates a pulse signal on the signal CK_N2 so that an up edge occurs in the signal CK_N2. In synchronization with the up edge of the signal CK_N2, the latch of the FF 18 is reset so that a down edge occurs in the output clock CLK (see circled numerals 9 and 10 in FIG. 7). In addition, the switch SW3 is turned on by the signal CK_N2 at high level, and hence stored charge in the capacitor C3 is discharged via the switch SW3 so that the voltage Vc decreases to zero (see circled numeral 11 in FIG. 7). After that, the signal CK_N2 returns to low level at timing T$_{A4}$, and the switch SW3 is turned off.

After timing T$_{A4}$, timing T$_{A5}$ comes. The length between timing T$_{A1}$ and timing T$_{A5}$ is equal to the period of the external clock CK_EX, and an up edge occurs again in the external clock CK_EX at timing T$_{A5}$. Although a down edge occurs in the external clock CK_EX at timing after timing T$_{A1}$ and before timing T$_{A5}$, the down edge timing does not affect the operation of the clock generation circuit 1. The operation in one period of the external clock CK_EX starting from timing T$_{A1}$ is the same as the operation in one period of the external clock CK_EX starting from timing T$_{A5}$, and the same operation is repeated after that.

In FIG. 7, the time difference between timing T$_{A1}$ and timing T$_{A2}$ is shown to have some length for convenience sake of illustration, but the time difference between timing T$_{A1}$ and timing T$_{A2}$ is sufficiently short compared with the period of the external clock CK_EX. When omitting the time difference (considering in this way), the length of the interval during which the output clock CLK is at high level (i.e. the interval between timing T$_{A1}$ and timing T$_{A3}$) is the same as the length of the interval during which the output clock CLK is at low level (i.e. the interval between timing T$_{A3}$ and timing T$_{A5}$), and hence the duty ratio of the output clock CLK is 50%. If the time difference is long and cannot be omitted, the value of the constant current I2 should be adjusted so that a fixed duty ratio of 50% is achieved in consideration of the time difference.

Note that just after the clock generation circuit 1 is activated, charging of the voltage Vb is started from zero volts, and hence the value of the voltage Vb just before the switch SW2 is turned on does not become "VAL$_A$", but after the clock generation circuit 1 operates for a certain period, the value of the voltage Vb just before the switch SW2 is turned on is converged to "VAL$_A$". The above description with reference to FIG. 7 focuses on the operation after this convergence.

Second Example

Figure 8:
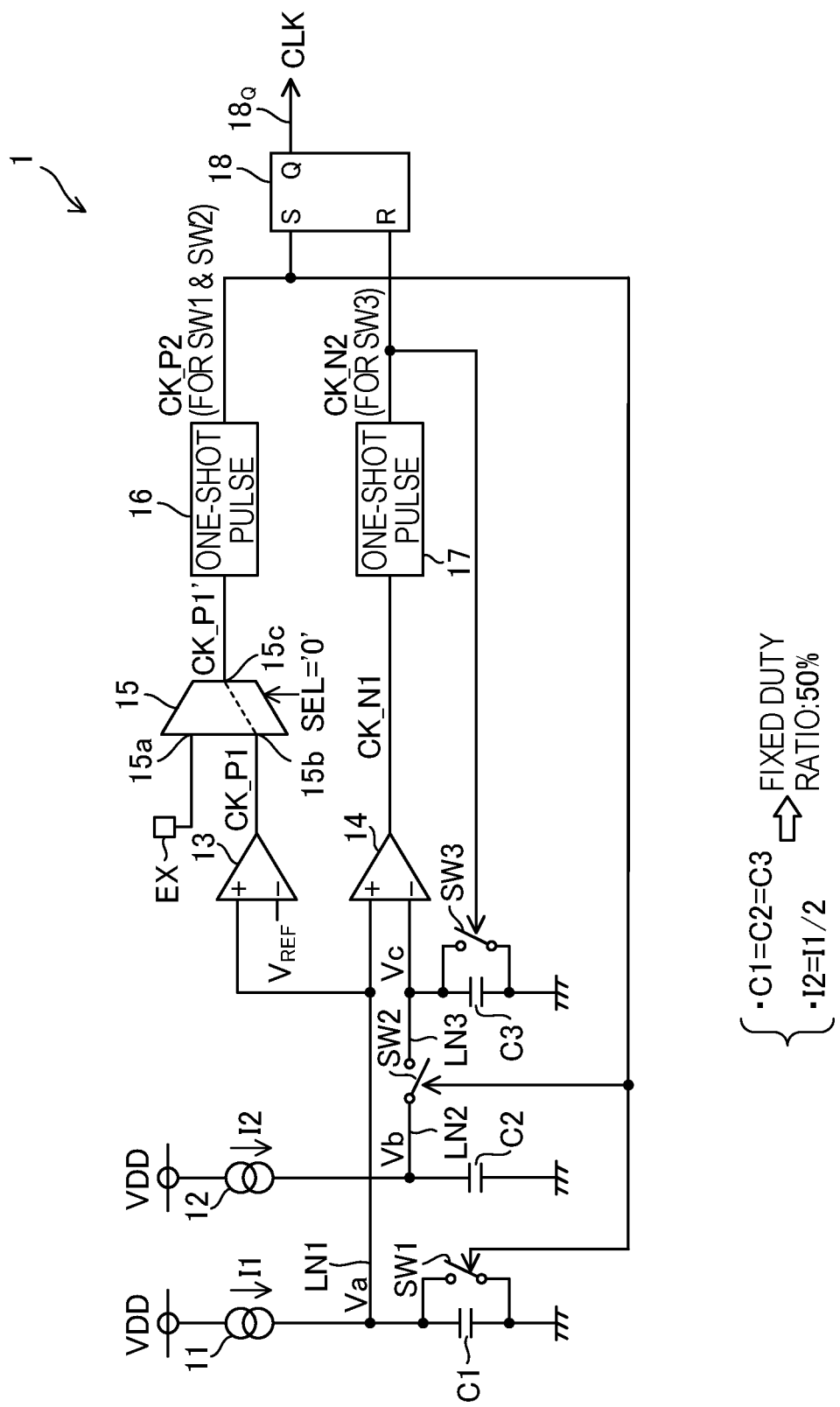
FIG. 8 is a diagram showing operating conditions of the clock generation circuit assumed for a second example of the present invention.

A second example is described. In the second example, as illustrated in FIG. 8, it is supposed that the external clock CK_EX is not input to the input terminal EX and that the selection signal SEL is "0". In addition, it is supposed that the capacitance values of the capacitors C1, C2, and C3 are the same, and that the value of the constant current I2 is ½ of the value of the constant current I1. In this case, similarly to the first example, the fixed duty ratio is set to 50%.

Figure 9:
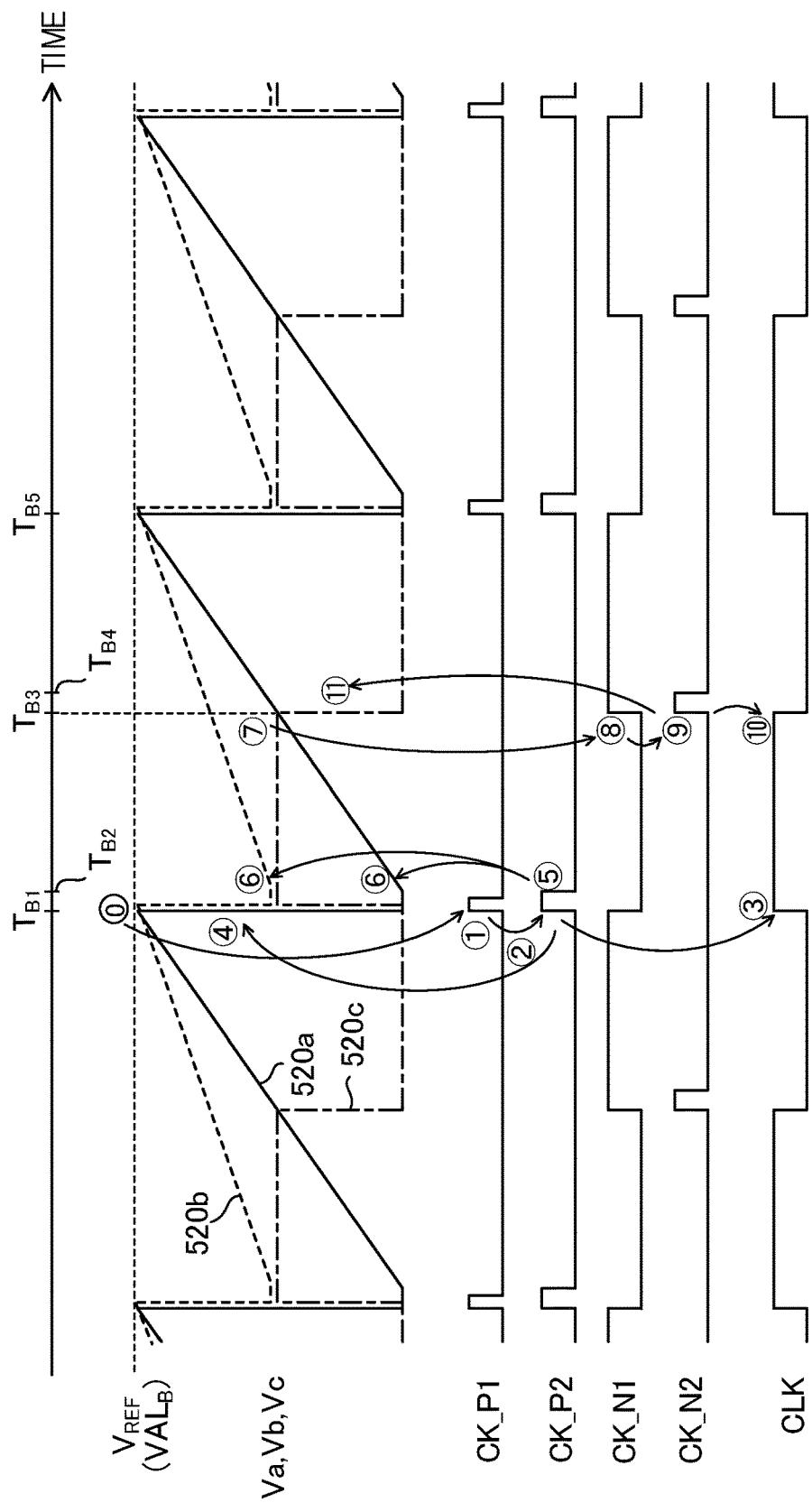
FIG. 9 is a timing chart of the clock generation circuit according to the second example of the present invention.

FIG. 9 is a signal waveform diagram under supposition of the second example. When the external clock CK_EX is not input, the output clock CLK is generated in synchronization with the signal CK_P1 as the internal clock. An up edge occurs periodically in the signal CK_P1, and an occurrence interval of the up edges in the signal CK_P1 corresponds to the period of the internal clock. A certain period of the internal clock is noted, and the up edge timing of the internal clock is regarded as a starting point, for describing an operation of clock generation circuit 1. In FIG. 9, a solid polygonal line 520a, a broken polygonal line 520b, and a dot-dashed polygonal line 520c indicate waveforms of the voltages Va, Vb, and Vc, respectively.

In a period just before one period of the internal clock starting from timing T$_{B1}$, the constant current I1 charges the capacitor C1 so that the voltage Va increases monotonously, and the voltage Va, which satisfied "Va<V$_{REF}$" before timing T$_{B1}$, reaches the reference voltage V$_{REF}$ at timing T$_{B1}$ (see circled numeral 0 in FIG. 9). The value of the reference voltage V$_{REF}$ is denoted by "VALE". Then, at timing T$_{B1}$, the comparator 13 operates to generate an up edge in the signal CK_P1 (see circled numeral 1 in FIG. 9). An up edge occurs in the signal CK_P1, and in synchronization with the up edge, the one-shot pulse circuit 16 generates a pulse signal on the signal CK_P2 so that an up edge occurs in the signal CK_P2. Further in synchronization with the up edge of the signal CK_P2, an up edge is generated also in the output clock CLK by the FF 18 (see circled numerals 2 and 3 in FIG. 9).

In addition, just before the up edge occurs in the signal CK_P2, the voltage values of the voltages Va and Vb are equal to the positive voltage value VAL$_B$, and the voltage Vc is zero. Therefore the signal CK_N1 is at high level, and the signal CK_N2 is at low level. From timing T$_{B1}$ as a starting point, the output pulse signal of the one-shot pulse circuit 16 causes the signal CK_P2 to be at high level for the micro time Δt1 (see FIG. 5A), and hence the switches SW1 and SW2 are in ON state during a high level period of the signal CK_P2. As a result, just after timing T$_{B1}$ (substantially at timing T$_{B1}$), stored charge in the capacitor C1 is discharged via the switch SW1 so that the voltage Va decreases to zero, and stored charge in the capacitor C2 is divided between the capacitors C2 and C3 via the switch SW2 so that the voltage values of the voltages Vb and Vc both become "VAL$_B$/2" (see circled numeral 4 in FIG. 9). As a result, the comparator 14 operates to generate a down edge in the signal CK_N1, and the signal CK_P1 returns to low level. Note that in this timing, the signal CK_N2 is at low level, and hence the switch SW3 is in OFF state.

After that, the signal CK_P2 returns to low level at timing T$_{B2}$, and hence the switches SW1 and SW2 are turned off. Therefore, the constant current I1 charges the capacitor C1 so that the voltage Va starts to increase from zero volts as the first initial voltage, and the constant current I2 charges the capacitor C2 so that the voltage Vb starts to increase from "VAL$_B$/2" as the second initial voltage (see circled numerals 5 and 6 in FIG. 9). It is supposed that "I2=I1/2" holds, and hence the increase gradient of the voltage Vb is ½ of the increase gradient of the voltage Va. Note that it is supposed that the micro time Δt1 is sufficiently short, and charging of the capacitors C2 and C3 by the constant current I2 in the interval during which the signal CK_P2 is at high level is omitted. Then, after timing T$_{B2}$, the capacitor C3 holds the voltage Vc at a value "VAL$_B$/2". This holding is maintained until timing T$_{B3}$ described later.

After timing T$_{B2}$, until timing T$_{B3}$, "Va<Vc" holds, and the signal CK_N1 is at low level. The increase of the voltage Va from timing $T_{B2}$ as a starting point causes the value of the voltage Va to reach the voltage value "$VAL_B/2$" held in the capacitor C3 at timing $T_{B3}$, and the comparator 14 operates to generate an up edge in the signal CK_N1 (see circled numerals 7 and 8 in FIG. 9). In synchronization with the up edge in the signal CK_N1, the one-shot pulse circuit 17 generates a pulse signal on the signal CK_N2 so that an up edge occurs in the signal CK_N2. In synchronization with the up edge of the signal CK_N2, the latch of the FF 18 is reset so that a down edge occurs in the output clock CLK (see circled numerals 9 and 10 in FIG. 9). In addition, receiving the signal CK_N2 at high level, the switch SW3 is turned on, and hence the stored charge in the capacitor C3 is discharged via the switch SW3, so that the voltage Vc decreases to zero (see circled numeral 11 in FIG. 9). After that, at timing $T_{B4}$, the signal CK_N2 returns to low level, and the switch SW3 is turned off.

After timing $T_{B4}$, timing $T_{B5}$ comes. The length between timing $T_{B1}$ and timing $T_{B5}$ is equal to the period of the internal clock, and at timing $T_{B5}$, an up edge occurs in the internal clock (i.e. signal CK_P1) again. The operation in one period of the internal clock starting from timing $T_{B1}$ is the same as the operation in one period of the internal clock starting from timing $T_{B5}$, and after that, the same operation is repeated.

In FIG. 9, the time difference between timing $T_{B1}$ and timing $T_{B2}$ is shown to have some length for convenience sake of illustration, but the time difference between timing $T_{B1}$ and timing $T_{B2}$ is sufficiently short compared with the period of the internal clock. When omitting the time difference (considering in this way), the length of the interval during which the output clock CLK is at high level (i.e. the interval between timing $T_{B1}$ timing $T_{B3}$) is the same as the length of the interval during which the output clock CLK is at low level (i.e. the interval between timing $T_{B3}$ and timing $T_{B5}$), and hence the duty ratio of the output clock CLK is 50%. If the time difference is long and cannot be omitted, the value of the constant current I2 should be adjusted so that a fixed duty ratio of 50% is achieved in consideration of the time difference.

Note that just after the clock generation circuit 1 is activated, charging of the voltage Vb is started from zero volts, and hence the value of the voltage Vb just before the switch SW2 is turned on does not become "$VAL_B$", but after the clock generation circuit 1 operates for a certain period, the value of the voltage Vb just before the switch SW2 is turned on is converged to "$VAL_B$". The above description with reference to FIG. 9 focuses on the operation after this convergence.

Third Example

Figure 10:
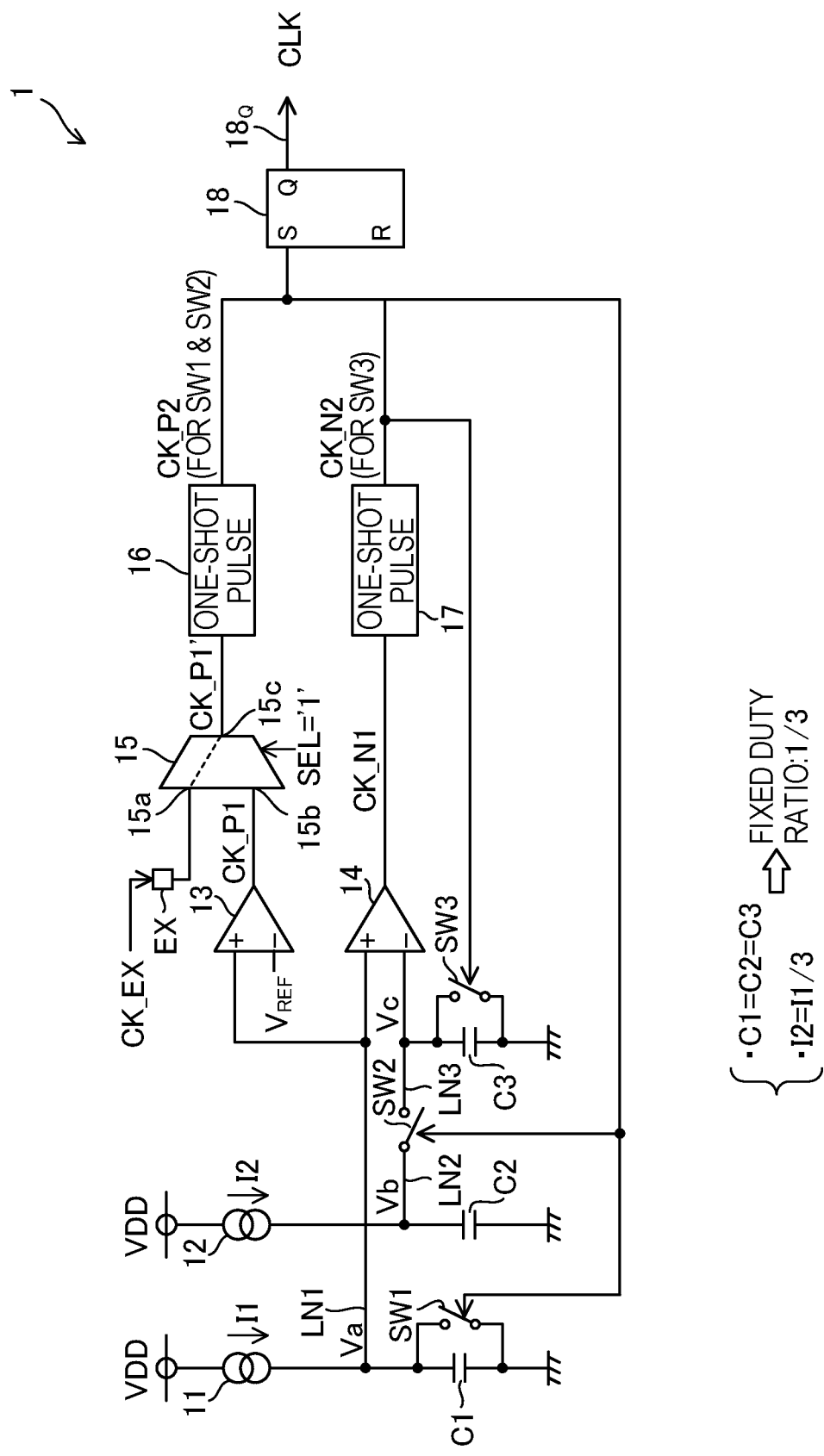
FIG. 10 is a diagram showing operating conditions of the clock generation circuit assumed for a third example of the present invention.

A third example is described. In the third example, as illustrated in FIG. 10, it is supposed that the external clock CK_EX is input to the input terminal EX and that the selection signal SEL is "1". In addition, it is supposed that the capacitance values of the capacitors C1, C2, and C3 are the same, and that the value of the constant current I2 is ⅓ of the value of the constant current I1. In this case, the fixed duty ratio is set to 1/3 (approximately 33%).

Figure 11:
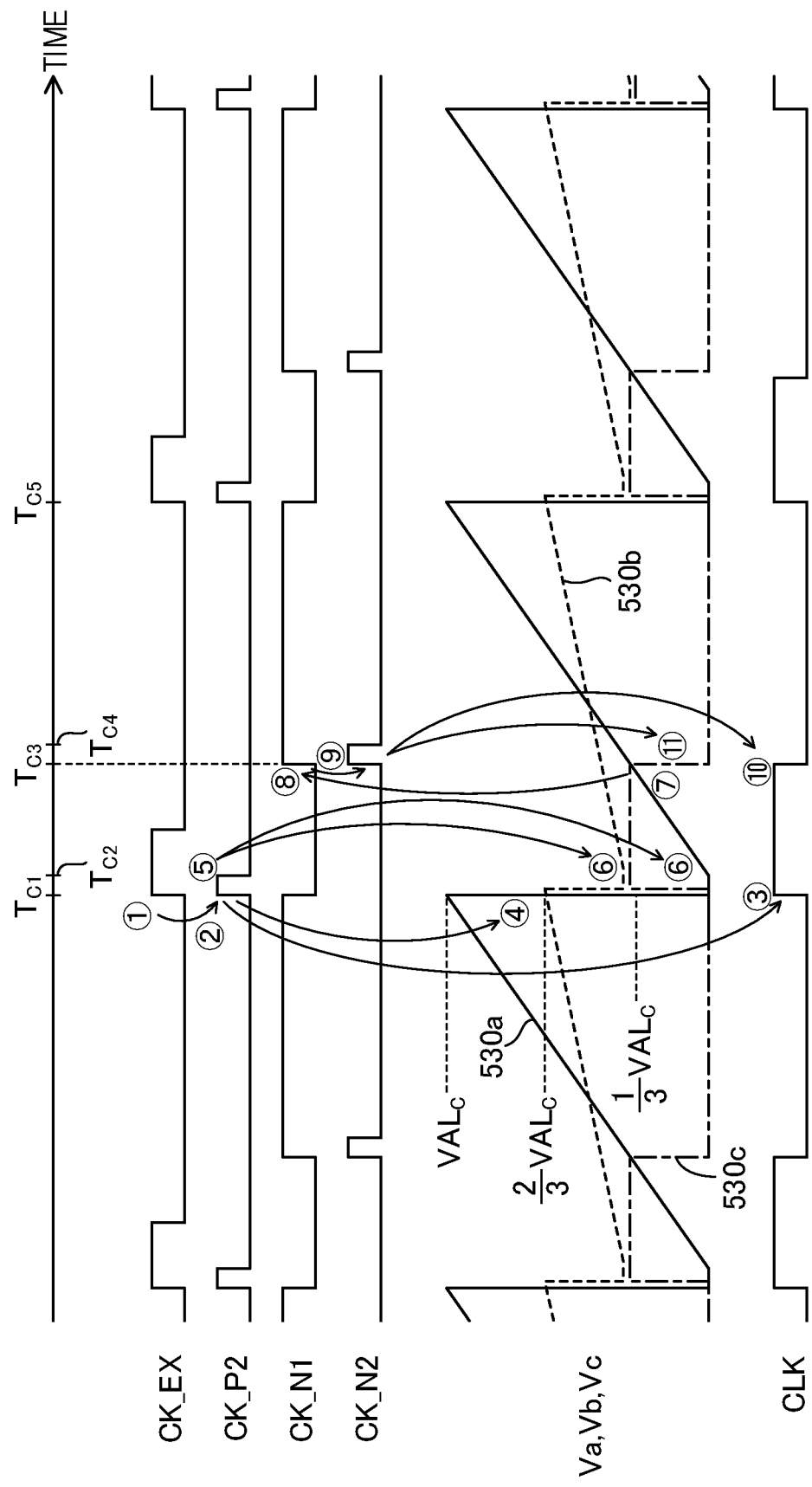
FIG. 11 is a timing chart of the clock generation circuit according to the third example of the present invention.

FIG. 11 is a signal waveform diagram under supposition of the third example. A certain period of the external clock CK_EX is noted, and the up edge timing of the external clock CK_EX is regarded as a starting point, for describing the operation of clock generation circuit 1. In FIG. 11, a solid polygonal line 530a, a broken polygonal line 530b, a dot-dashed polygonal line 530c indicate waveforms of the voltages Va, Vb, and Vc, respectively.

An up edge (i.e. switch from low level to high level) occurs in the external clock CK_EX at timing $T_{C1}$, and in synchronization with the up edge, the one-shot pulse circuit 16 generates a pulse signal on the signal CK_P2 so that an up edge occurs in the signal CK_P2. Further in synchronization with the up edge of the signal CK_P2, an up edge is generated also in the output clock CLK by the FF 18 (see circled numerals 1 to 3 in FIG. 11).

In addition, just before the up edge occurs in the signal CK_P2, the voltage value of the voltage Va is a positive predetermined voltage value $VAL_C$, the voltage value of the voltage Vb is "$VAL_C \times ⅔$", and the voltage Vc is zero. Therefore the signal CK_N1 is at high level, and the signal CK_N2 is at low level. The voltage value $VAL_C$ is determined depending on the period of the external clock CK_EX, a value of the constant current I1, and the like. The timing $T_{C1}$ is regarded as a starting point, and the output pulse signal of the one-shot pulse circuit 16 makes the signal CK_P2 be at high level for the micro time Δt1 (see FIG. 5A). Therefore, the switches SW1 and SW2 are in ON state during a high level period of the signal CK_P2. As a result, just after the timing $T_{C1}$ (substantially at timing $T_{C1}$), stored charge in the capacitor C1 is discharged via the switch SW1, so that the voltage Va is decreased to zero, while stored charge in the capacitor C2 is divided between the capacitors C2 and C3 via the switch SW2. Thus, the voltage values of the voltages Vb and Vc are both "$VAL_C/3$" (see circled numeral 4 in FIG. 11). As a result, when the comparator 14 works, a down edge occurs in the signal CK_N1. Note that in this timing, the signal CK_N2 is at low level, and hence the switch SW3 is in OFF state.

After that, the signal CK_P2 returns to low level at timing $T_{C2}$, and then the switches SW1 and SW2 are turned off. Therefore the constant current I1 charges the capacitor C1 so that the voltage Va starts to increase from zero volts as a first initial voltage, and the constant current I2 charges the capacitor C2 so that the voltage Vb starts to increase from "$VAL_C/3$" as the second initial voltage (see circled numerals 5 and 6 in FIG. 11). It is supposed that "I2=I1/3" holds, and hence the increase gradient of the voltage Vb is ⅓ of the increase gradient of the voltage Va. Note that it is supposed that the micro time Δt1 is sufficiently short so that charging of the capacitors C2 and C3 by the constant current I2 during the interval in which the signal CK_P2 is at high level is omitted. Then, after timing $T_{C2}$, the capacitor C3 holds the voltage Vc at a value of value "$VAL_C/3$". This holding is maintained until timing $T_{C3}$ described later.

After timing $T_{C2}$ until timing $T_{C3}$, "Va<Vc" holds, and the signal CK_N1 is at low level. The increase of voltage Va from timing $T_{C2}$ as a starting point causes the value of the voltage Va to reach the voltage value "$VAL_C/3$" held by the capacitor C3 at timing $T_{C3}$, and the comparator 14 operates to generate an up edge in the signal CK_N1 (see circled numerals 7 and 8 in FIG. 11). In synchronization with the up edge of the signal CK_N1, the one-shot pulse circuit 17 generates a pulse signal on the signal CK_N2 so that an up edge occurs in the signal CK_N2. In synchronization with the up edge of the signal CK_N2, the latch of the FF 18 is reset so that a down edge occurs in the output clock CLK (see circled numerals 9 and 10 in FIG. 11). In addition, the switch SW3 is turned on by the signal CK_N2 at high level, and hence the stored charge in the capacitor C3 is discharged via the switch SW3 so that the voltage Vc decreases to zero (see circled numeral 11 in FIG. 11). After that, the signal CK_N2 returns to low level at timing $T_{C4}$, and the switch SW3 is turned off.

After timing $T_{C4}$, timing $T_{C5}$ comes. The length between timing $T_{C1}$ and timing $T_{C5}$ is equal to the period of the external clock CK_EX, and an up edge occurs again in the external clock CK_EX at timing $T_{C5}$. Although a down edge occurs in the external clock CK_EX at timing after timing $T_{C1}$ and before timing $T_{C5}$, the down edge timing does not affect the operation of the operation of clock generation circuit 1. The operation in one period of the external clock CK_EX starting from timing $T_{C1}$ is the same as the operation in one period of the external clock CK_EX starting from timing $T_{C5}$, and the same operation is repeated after that.

In FIG. 11, the time difference between timing $T_{C1}$ and timing $T_{C2}$ is shown to have some length for convenience sake of illustration, but the time difference between timing $T_{C1}$ and timing $T_{C2}$ is sufficiently short compared with the period of the external clock CK_EX. When, omitting the time difference (considering in this way), a ratio of the length of the interval during which the output clock CLK is at high level (i.e. the interval between timing $T_{C1}$ and timing $T_{C3}$) to the length of the interval during which the output clock CLK is at low level (i.e. the interval between timing $T_{C3}$ and timing $T_{C5}$) is 1:2, and hence the duty ratio of the output clock CLK is 1/3. If the time difference is long and cannot be omitted, the value of the constant current I2 should be adjusted so that a fixed duty ratio of 1/3 is achieved in consideration of the time difference.

Note that just after the clock generation circuit 1 is activated, charging of the voltage Vb is started from zero volts, and hence the value of the voltage Vb just before the switch SW2 is turned on does not become "$VAL_C \times 2/3$", but after the clock generation circuit 1 operates for a certain period, the value of the voltage Vb just before the switch SW2 is turned on is converged to "$VAL_C \times 2/3$". The above description with reference to FIG. 11 focuses on the operation after this convergence.

Fourth Example

A fourth example is described. A ratio of the constant current I1 to the constant current I2 is different between the first example and the third example, and the fixed duty ratio can be changed by changing the above-mentioned ratio. Similarly, in the second example, the fixed duty ratio can be set to a desired value by adjusting a ratio between the constant currents I1 and I2.

Extended thinking can derive the following. By setting a proportional relationship indicated by the following equation (1) between value $VAL_{I1}$ of the constant current I1 and value $VAL_{I2}$ of the constant current I2, and by adjusting the proportionality factor $k_I$, it is possible to set the fixed duty ratio to a desired value (see variation to the third example viewed from the first example).

$$VAL_{I1} = k_I \times VAL_{I2} \quad (1)$$

In addition, also by setting a proportional relationship indicated by the following equation (2) between capacitance value $VAL_{C1}$ of the capacitor C1, capacitance value $VAL_{C2}$ of the capacitor C2, and capacitance value $VAL_{C3}$ of the capacitor C3, and by adjusting the proportionality factors $k_{C1}$ and $k_{C2}$, it is possible to set the fixed duty ratio to a desired value.

$$VAL_{C1} = k^{C2} \times VAL_{C2} = k^{C3} \times VAL_{C3} \quad (2)$$

Each of the proportionality factors $k_{C2}$ and $k_{C3}$ may be one or may not be one. The proportionality factors $k_{C2}$ and $k_{C3}$ can be equal to each other or can be different from each other. Although the proportionality factor $k_I$ is not one in the first to third examples, but the proportionality factor $k_I$ can be one depending on values of the proportionality factors $k_{C2}$ and $k_{C3}$. For instance, in order to set the fixed duty ratio to 50% when "$k_{C2} = k_{C3} = 2$" holds, it is sufficient that "$k_I = 1$" holds.

Fifth Example

Figure 12:
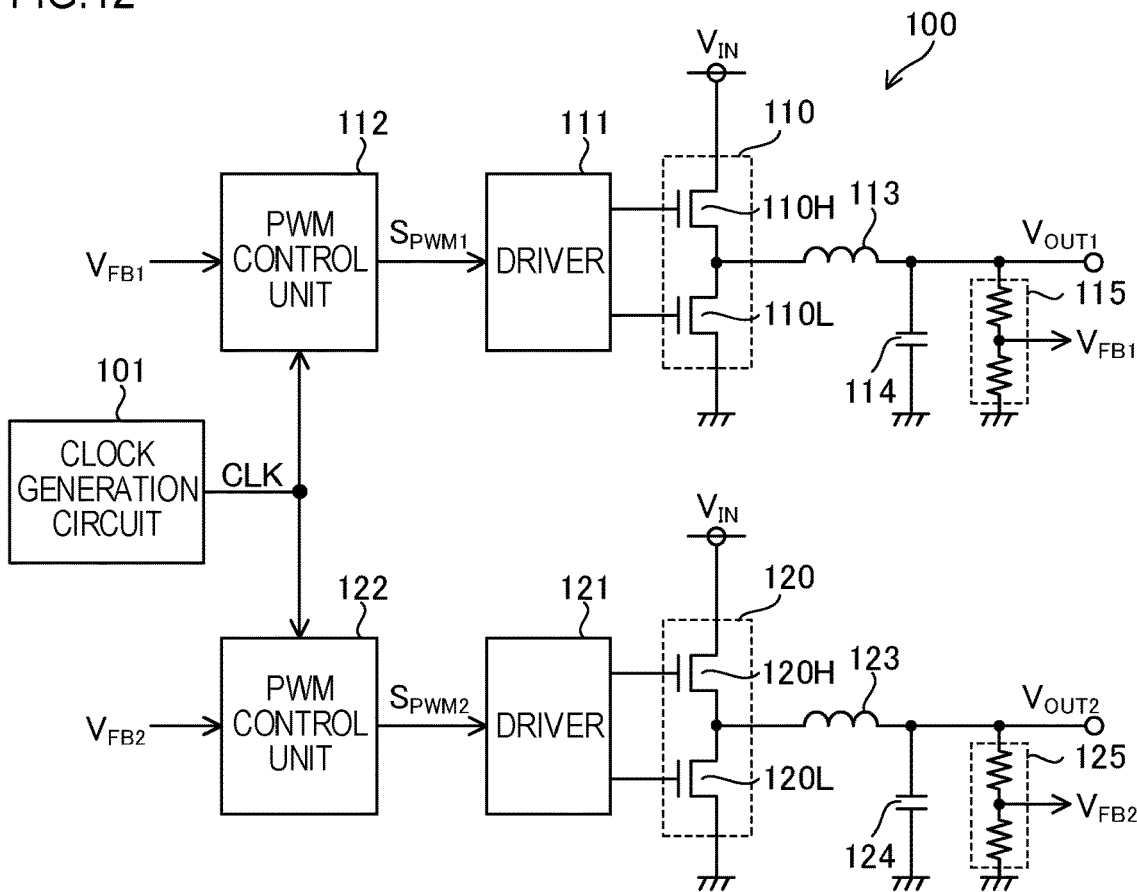
FIG. 12 is a structural diagram of a switching power supply device according to a fifth example of the present invention.

A fifth example is described. An arbitrary switching power supply device can be constituted using the clock generation circuit 1. For instance, a switching power supply device 100 as illustrated in FIG. 12 may be constituted. The switching power supply device 100 is a multi-channel output type power supply device, which generates 2-channel output voltages $V_{OUT1}$ and $V_{OUT2}$ from an input voltage $V_{IN}$. The input voltage $V_{IN}$ and the output voltages $V_{OUT1}$ and $V_{OUT2}$ are predetermined positive DC voltages ("$V_{IN} > V_{OUT1}$" and "$V_{IN} > V_{OUT2}$" hold). Match or mismatch between the output voltages $V_{OUT1}$ and $V_{OUT2}$ does not matter.

The switching power supply device 100 includes a first channel circuit, a second channel circuit, and a clock generation circuit 101 that is the clock generation circuit 1. The first channel circuit includes an output stage circuit 110, a driver 111, a PWM control unit 112, a coil 113, a capacitor 114, and a voltage divider circuit 115. The second channel circuit includes an output stage circuit 120, a driver 121, a PWM control unit 122, a coil 123, a capacitor 124, and a voltage divider circuit 125. PWM stands for pulse width modulation. Each of the output stage circuits 110 and 120 includes a half bridge circuit consisting of a high-side transistor and a low-side transistor connected in series. The high-side transistor is disposed on a high voltage side, while the low-side transistor is disposed on a low voltage side, and in this state the input voltage $V_{IN}$ is applied to the half bridge circuit. The high-side transistor and the low-side transistor in the output stage circuit 110 are transistors 110H and 110L, respectively. The high-side transistor and the low-side transistor in the output stage circuit 120 are transistors 120H and 120L, respectively. Each transistor in the output stage circuits 110 and 120 is constituted of a metal-oxide-semiconductor field-effect transistor (MOSFET) or the like.

An operation of the first channel circuit is described. The PWM control unit 112 generates a PWM signal $S_{PWM1}$ to stabilize the output voltage $V_{OUT1}$ at a desired target voltage based on a feedback voltage $V_{FB1}$ obtained by dividing the output voltage $V_{OUT1}$ with the voltage divider circuit 115. The PWM signal $S_{PWM1}$ designates an ON interval during which the transistor 110H is in ON state and an OFF interval during which the transistor 110H is in OFF state. It is supposed that the interval during which the PWM signal $S_{PWM1}$ is at high level corresponds to an ON interval of the transistor 110H and that the interval during which the PWM signal $S_{PWM1}$ is at low level corresponds to the OFF interval of the transistor 110H. Omitting dead time for preventing occurrence of through current, when the transistor 110H is in ON state, the transistor 110L is in OFF state, and when the transistor 110H is in OFF state, the transistor 110L is in ON state. The driver 111 alternately turns on and off the transistors 110H and 110L according to the PWM signal $S_{PWM1}$, so as to perform switching of the input voltage $V_{IN}$. A rectangular wave-like switching voltage obtained by switching with the output stage circuit 110 (i.e. a signal obtained by pulse width modulation of the input voltage $V_{IN}$ with the PWM signal $S_{PWM1}$) appears at the connection node between the transistors 110H and 110L. This switching voltage is rectified and smoothed by a rectifying and smoothing circuit including the coil 113 and the capacitor 114 so that the output voltage $V_{OUT1}$ is obtained.

An operation of the second channel circuit is described. The PWM control unit 122 generates a PWM signal $S_{PWM2}$ to stabilize the output voltage $V_{OUT2}$ at a desired target voltage based on a feedback voltage $V_{FB2}$ obtained by dividing the output voltage $V_{OUT2}$ with the voltage divider circuit 125. The PWM signal $S_{PWM2}$ designates an ON interval during which the transistor 120H is in ON state and an OFF interval during which the transistor 120H is in OFF state. It is supposed that the interval during which the PWM signal $S_{PWM2}$ is at high level corresponds to an ON interval of the transistor 120H and that the interval during which the PWM signal $S_{PWM2}$ is at low level corresponds to the OFF interval of the transistor 120H. Omitting dead time for preventing occurrence of through current, when the transistor 120H is in ON state, the transistor 120L is in OFF state, and when the transistor 120H is in OFF state, the transistor 120L is in ON state. The driver 121 alternately turns on and off the transistors 120H and 120L according to the PWM signal $S_{PWM2}$, so as to perform switching of the input voltage $V_{IN}$. A rectangular wave-like switching voltage obtained by switching with the output stage circuit 120 (i.e. a signal obtained by pulse width modulation of the input voltage $V_{IN}$ with the PWM signal $S_{PWM2}$) appears at the connection node between the transistors 120H and 120L. This switching voltage is rectified and smoothed by a rectifying and smoothing circuit including the coil 123 and the capacitor 124 so that the output voltage $V_{OUT2}$ is obtained.

The PWM control units 112 and 122 are supplied with the output clock CLK of the clock generation circuit 101, and each of the PWM control units 112 and 122 generates a PWM signal having the same frequency as the output clock CLK (i.e. the pulse width modulation is performed on the input voltage $V_{IN}$ at the frequency of the output clock CLK in each channel). However, in this case, the PWM control units 112 and 122 generate the PWM signals $S_{PWM1}$ and $S_{PWM2}$ so that a phase shift occurs between the PWM signals $S_{PWM1}$ and $S_{PWM2}$.

Figure 13:
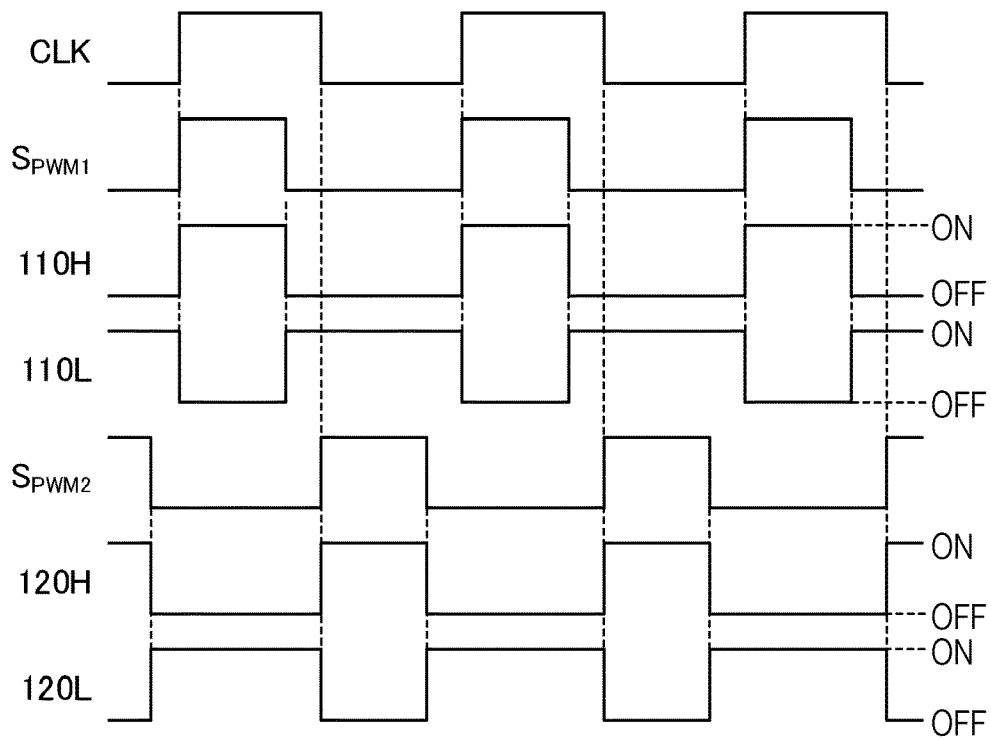
FIG. 13 is a timing chart of a switching power supply device according to the fifth example of the present invention.

More specifically, for example, as illustrated in FIG. 13, the clock generation circuit 101 is constituted so that the output clock CLK having a fixed duty ratio of 50% is generated. The PWM control units 112 and 122 are constituted so that an up edge occurs in the PWM signal $S_{PWM1}$ at an up edge of the output clock CLK (i.e. so that an ON interval of the transistor 110H is started), and so that an up edge occurs in the PWM signal $S_{PWM2}$ at a down edge of the output clock CLK (i.e. so that an ON interval of the transistor 120H is started). In this way, phases of the PWM signals $S_{PWM1}$ and $S_{PWM2}$ are shifted from each other by 180 degrees (i.e. the output stage circuits 110 and 120 are PWM-driven in the state where the phases are shifted from each other by 180 degrees). The lengths of intervals at which the PWM signals $S_{PWM1}$ and $S_{PWM2}$ become high level are controlled based on the feedback voltages $V_{FB1}$ and $V_{FB2}$, respectively.

By shifting phases of the output stage circuits 110 and 120 in PWM drive from each other by 180 degrees, it is possible to reduce mutual interference between channels. For instance, it is possible to obtain effects of reduction of a peak value of noise generated from the entire switching power supply device 1, reduction of ripple in the input voltage $V_{IN}$, and the like. In this case, by using the clock generation circuit according to the present invention, the above-mentioned effect can be obtained regardless of a duty ratio of the input external clock CK_EX, and even if the external clock CK_EX is not input.

Sixth Example

Figure 14:
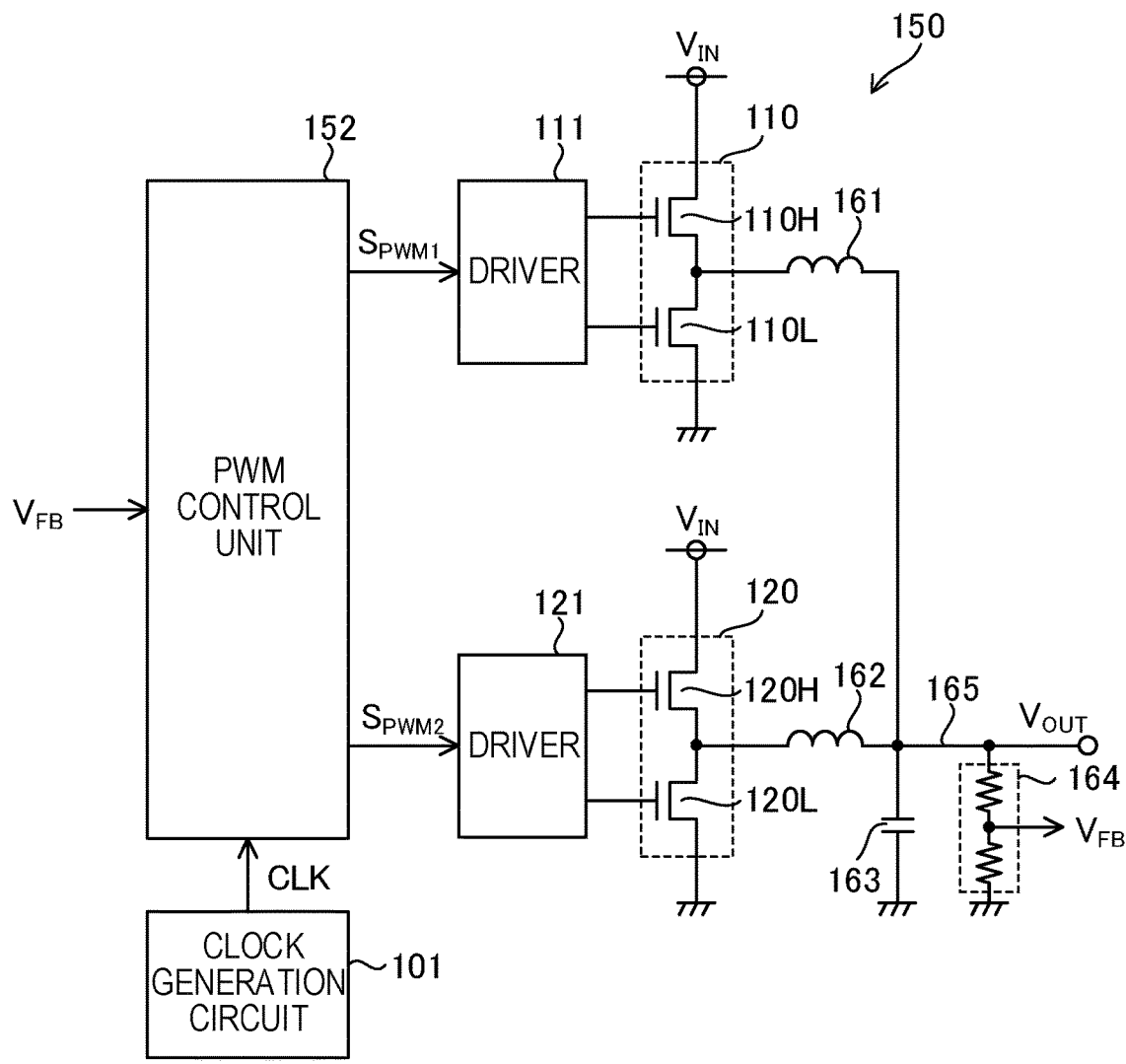
FIG. 14 is a structural diagram of a switching power supply device according to a sixth example of the present invention.

A sixth example is described. The clock generation circuit 1 according to the present invention can also be used to constitute a multiphase DC/DC converter. FIG. 14 illustrates a structure of a switching power supply device 150 as a multiphase DC/DC converter. The switching power supply device 150 generates an output voltage $V_{OUT}$ by stepping down the input voltage $V_{IN}$. The input voltage $V_{IN}$ and the output voltage $V_{OUT}$ are predetermined positive DC voltages ("$V_{IN} > V_{OUT}$" holds).

The switching power supply device 150 includes a first phase circuit, a second phase circuit, a PWM control unit 152 arranged to supply these circuits with PWM signals, the clock generation circuit 101 as the clock generation circuit 1, coils 161 and 162, a capacitor 163, and a voltage divider circuit 164. The first phase circuit is constituted of the output stage circuit 110 and the driver 111, and the second phase circuit is constituted of the output stage circuit 120 and the driver 121. Structures of the output stage circuits 110 and 120 are the same as those described above in the fifth example. However, in the switching power supply device 150, it is supposed that the connection node between the transistors 110H and 110L of the output stage circuit 110 is connected to a line 165 applied with the output voltage $V_{OUT}$ via the coil 161, and that the connection node between the transistors 120H and 120L of the output stage circuit 120 is connected to the line 165 via the coil 162. The line 165 is connected to the ground via the capacitor 163.

The PWM control unit 152 generates the PWM signals $S_{PWM1}$ and $S_{PWM2}$ to stabilize the output voltage $V_{OUT}$ at a desired target voltage, based on a feedback voltage $V_{FB}$ obtained by dividing the output voltage $V_{OUT}$ with the voltage divider circuit 164. The significance of the PWM signals $S_{PWM1}$ and $S_{PWM2}$ is as described above in the fifth example, and the operation of the driver 111 and the output stage circuit 110 based on the PWM signal $S_{PWM1}$ and the operation of the driver 121 and the output stage circuit 120 based on the PWM signal $S_{PWM2}$ are also as described above in the fifth example. Therefore the switching by the output stage circuit 110 based on the PWM signal $S_{PWM1}$ generates a rectangular wave-like switching voltage (i.e. a signal obtained by pulse width modulation of the input voltage $V_{IN}$ with the PWM signal $S_{PWM1}$) at the connection node between the transistors 110H and 110L, and the switching by the output stage circuit 120 based on the PWM signal $S_{PWM2}$ generates a rectangular wave-like switching voltage (i.e. a signal obtained by pulse width modulation of the input voltage $V_{IN}$ with the PWM signal $S_{PWM2}$) at the connection node between the transistors 120H and 120L. These switching voltages are rectified and smoothed by the rectifying and smoothing circuit including the coil 161, the coil 162, and the capacitor 163, so that the output voltage $V_{OUT}$ is obtained.

The PWM control unit 152 is supplied with the output clock CLK of the clock generation circuit 101, so as to generate the PWM signals $S_{PWM1}$ and $S_{PWM2}$ having the same frequency as the output clock CLK. However, in this case, the PWM control unit 152 generates the PWM signals $S_{PWM1}$ and $S_{PWM2}$ so that a phase shift occurs between the PWM signals $S_{PWM1}$ and $S_{PWM2}$.

More specifically, for example, similarly to the fifth example (see FIG. 13), the clock generation circuit 101 is constituted so that the output clock CLK having a fixed duty ratio of 50% is generated, and the PWM control unit 152 is constituted so that an up edge occurs in the PWM signal $S_{PWM1}$ at an up edge of the output clock CLK (i.e. so that an ON interval of the transistor 110H is started), and so that an up edge occurs in the PWM signal $S_{PWM2}$ at a down edge of the output clock CLK (i.e. an ON interval of the transistor 120H is started). In this way, phases of the PWM signals $S_{PWM1}$ and $S_{PWM2}$ are shifted from each other by 180 degrees (i.e. the output stage circuits 110 and 120 are PWM-driven in the state where the phases are shifted from each other by 180 degrees). The lengths of intervals at which the PWM signals $S_{PWM1}$ and $S_{PWM2}$ become high level are controlled based on the feedback voltage $V_{FB}$.

By shifting phases of the output stage circuits 110 and 120 in PWM drive from each other by 180 degrees, it is possible to appropriately obtain effects of adopting the multiphase method (increase of output current that can be drawn, reduction of ripple in the output voltage $V_{OUT}$, and the like). In this case, by using the clock generation circuit according to the present invention, the above-mentioned effect can be obtained regardless of a duty ratio of the input external clock CK_EX, and even if the external clock CK_EX is not input.

Seventh Example

Figure 15:
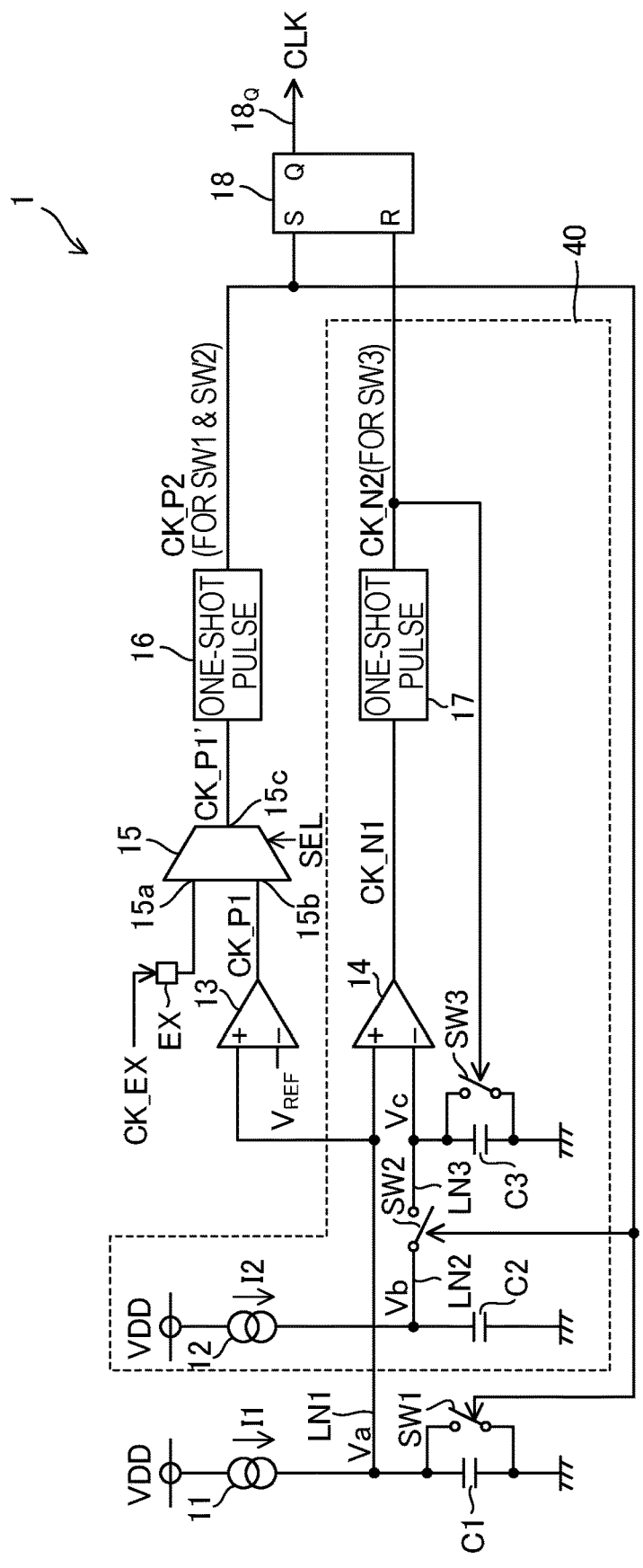
FIG. 15 is a diagram illustrating a manner in which a fixed duty ratio generation unit is included in a clock generation circuit according to a seventh example of the present invention.

A seventh example is described. The clock generation circuit 1 of FIG. 4 includes a circuit corresponding to the fixed duty ratio generation unit 4 of FIG. 1. In other words, as illustrated in FIG. 15, it can be considered that the clock generation circuit 1 includes a fixed duty ratio generation unit 40 corresponding to the fixed duty ratio generation unit 4, and that the fixed duty ratio generation unit 40 includes the constant current circuit I2, the capacitors C2 and C3, the switches SW2 and SW3, the comparator 14, and the one-shot pulse circuit 17.

Figure 16:
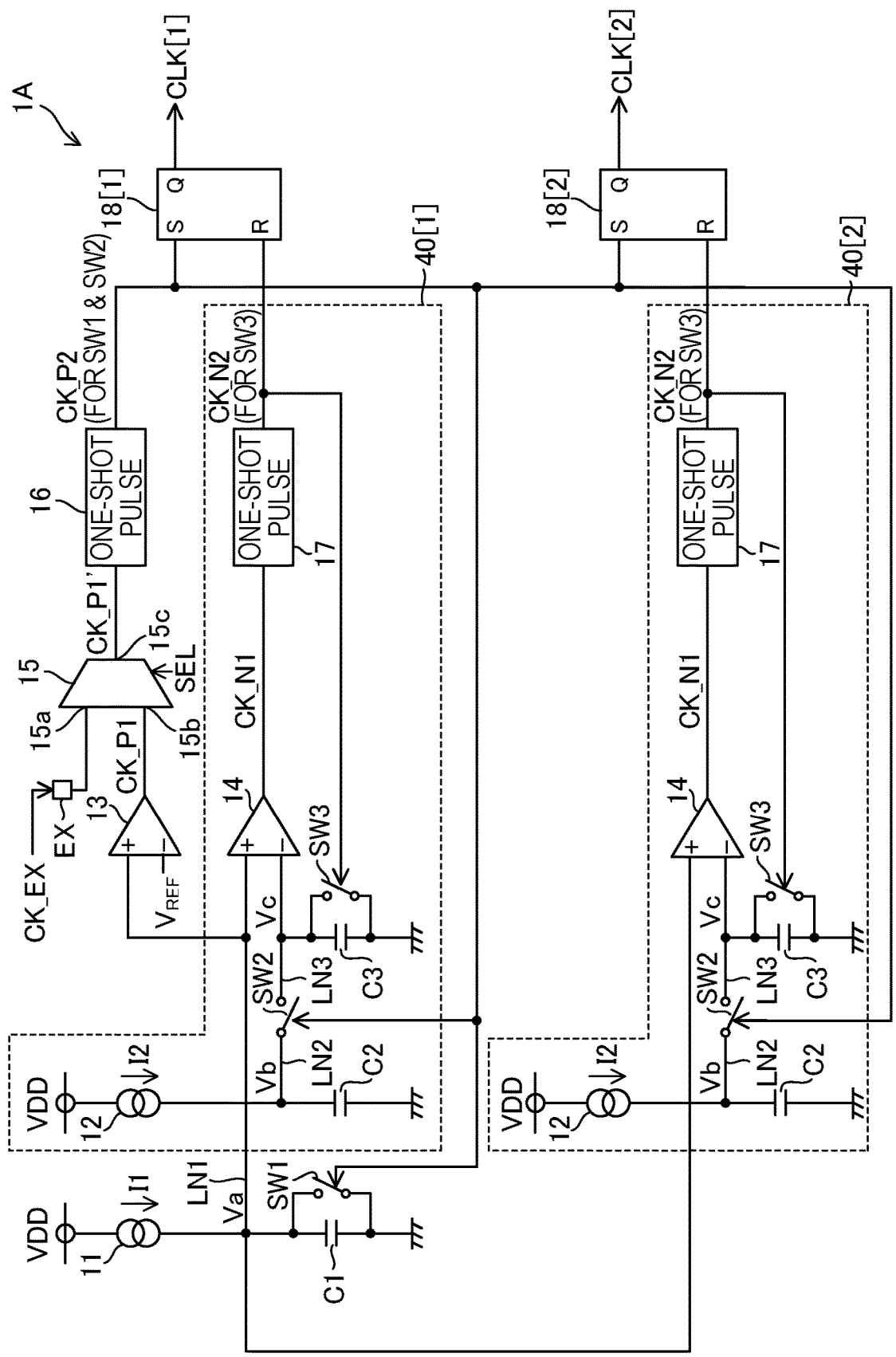
FIG. 16 is a structural diagram of a clock generation circuit including two fixed duty ratio generation units according to the seventh example of the present invention.

It may be possible to dispose a plurality of sets of the fixed duty ratio generation unit 40 and the FF 18 in the clock generation circuit. FIG. 16 illustrates a structure of a clock generation circuit 1A in which two sets of the fixed duty ratio generation unit 40 and the FF 18 are disposed. The clock generation circuit 1A further includes two sets of the fixed duty ratio generation unit 40 and the FF 18, in addition to a common circuit portion including the constant current circuit 11, the capacitor C1, the switch SW1, the comparator 13, the selection circuit 15, the one-shot pulse circuit 16, and the external clock input terminal EX. The fixed duty ratio generation unit 40 and the FF 18 in the first set are particularly referred to as the fixed duty ratio generation unit 40[1] and the FF 18[1], and the fixed duty ratio generation unit 40 and the FF 18 in the second set are particularly referred to as the fixed duty ratio generation unit 40[2] and the FF 18[2]. In addition, the output clocks CLK from the FF 18[1] and the FF 18[2] are particularly denoted by symbols CLK[1] and CLK[2], respectively.

A connection relationship between the common circuit portion and the fixed duty ratio generation unit 40[1] and the FF 18[1] is as described above in the basic example and the first to fourth examples. The operation of obtaining the output clock CLK (CLK[1]) from the FF 18[1] by using the common circuit portion, the fixed duty ratio generation unit 40[1] and the FF 18[1] is as described above in the basic example and the first to fourth examples. A connection relationship between the common circuit portion and the fixed duty ratio generation unit 40[2] and the FF 18[2] is as described above in the basic example and the first to fourth examples. The operation of obtaining the output clock CLK (CLK[2]) from the FF 18[2] by using the common circuit portion, the fixed duty ratio generation unit 40[2] and the FF 18[2] is as described above in the basic example and the first to fourth examples.

Therefore, for example, the voltage Va generated by the common circuit portion is commonly input to the non-inverting input terminals of the comparators 14 of the generation units 40[1] and 40[2], and the signal CK_P2 generated by the common circuit portion commonly controls ON and OFF of the switches SW2 of the generation units 40[1] and 40[2].

Further, the signal CK_P2 generated by the common circuit portion is commonly input to the set terminals of the FF 18[1] and FF 18[2]. In this way, the output clocks CLK[1] and CLK[2] have the same up edge timing.

On the other hand, the output signal CK_N2 of the one-shot pulse circuit 17 in the generation unit 40[1] is input to the reset terminal of the FF 18[1], and the output signal CK_N2 of the one-shot pulse circuit 17 in the generation unit 40[2] is input to the reset terminal of the FF 18[2]. Further, for example, the capacitance value of the capacitor C1 in the common circuit portion and capacitance values of the capacitors C2 and C3 in the generation units 40[1] and 40[2] are all set to the same value, while the value of the constant current I2 is set to different values between the generation units 40[1] and 40[2]. Then, the output clocks CLK[1] and CLK[2] have different duty ratios. As a matter of course, as described above in the fourth example, the duty ratios of the output clocks CLK[1] and CLK[2] can be individually set to desired duty ratios also by adjusting the capacitance values of the capacitors C2 and C3 instead of the value of the constant current I2.

Figure 17:
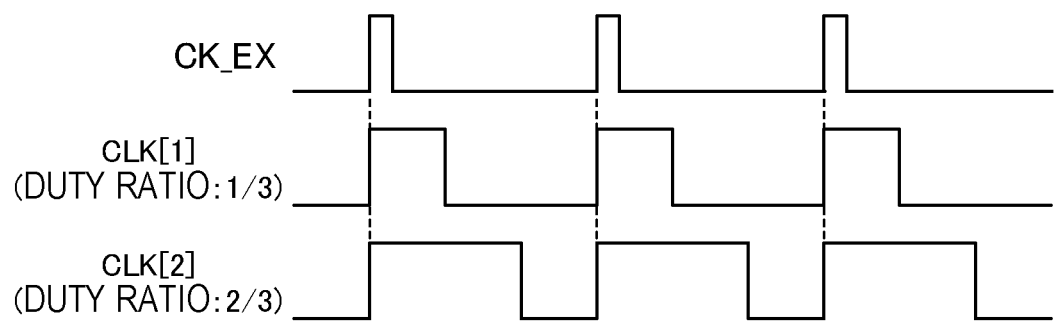
FIG. 17 is a relationship chart of an external clock and two output clocks in the clock generation circuit illustrated in FIG. 16.

FIG. 17 shows an example of a relationship between the external clock CK_EX and the output clocks CLK[1] and CLK[2] when the external clock CK_EX is input to the clock generation circuit 1A. The output clocks CLK[1] and CLK[2] are clocks having the same frequency as the external clock CK_EX, and the up edge timing of the output clocks CLK[1] and CLK[2] is the same as the up edge timing of the external clock CK_EX. In the example of FIG. 17, the duty ratios of the output clocks CLK[1] and CLK[2] do not depend on the duty ratio of the external clock CK_EX and are 1/3 and 2/3, respectively. In order to realize this, for example, the capacitance value of the capacitor C1 in the common circuit portion, and the capacitance values of the capacitors C2 and C3 in the generation units 40[1] and 40[2] are all set to the same value, and the values of the constant current I2 in the generation units 40[1] and 40[2] are set to ⅓ and ⅔ of the value of the constant current I1, respectively.

Using the clock generation circuit 1A and the method described above in the fifth example, it is possible to constitute a multi-channel output type switching power supply device that generates three channels of output voltages $V_{OUT1}$ to $V_{OUT3}$ from the input voltage $V_{IN}$. In this case, a third channel circuit having the same structure as the first channel circuit is added to the switching power supply device 100 of FIG. 12, so that the ON interval of the high-side transistor in the first channel circuit is started at an up edge of the output clock CLK[1], and that the ON interval of the high-side transistor in the second channel circuit is started at a down edge of the output clock CLK[1], and that the ON interval of the high-side transistor in the third channel circuit is started at a down edge of the output clock CLK[2]. In this way, the output stage circuits in the first to third channels can be driven with phases shifted from each other by 120 degrees (it is supposed that the duty ratios of the output clocks CLK[1] and CLK[2] are 1/3 and 2/3, respectively). However, it is also possible to simply dispose two clock generation circuits 1 of FIG. 4 so that the same driving can be realized. In each channel, the length of the ON interval of the high-side transistor is controlled based on the corresponding feedback voltage.

In addition, it is also possible to dispose three or more sets of the fixed duty ratio generation unit 40 and the FF 18 in the clock generation circuit, so as to generate three or more output clocks having different duty ratios. By applying this to a multi-channel output type switching power supply device, it is possible to drive four or more output stage circuits at different phases so as to obtain four or more channels of output voltages.

Using the clock generation circuit 1A and the method described above in the sixth example, it is possible to constitute a multiphase DC/DC converter that generates three phases of outputs from the input voltage $V_{IN}$. In this case, a third phase circuit having the same structure as the first phase circuit is added to the switching power supply device 150 of FIG. 14, so that the ON interval of the high-side transistor in the first phase circuit is started at an up edge of the output clock CLK[1], and that the ON interval of the high-side transistor in the second phase circuit is started at a down edge of the output clock CLK[1], and that the ON interval of the high-side transistor in the third phase circuit is started at a down edge of the output clock CLK[2]. In this way, the output stage circuits in the first to third phases can be driven with phases shifted from each other by 120 degrees (it is supposed that the duty ratios of the output clocks CLK[1] and CLK[2] are 1/3 and 2/3, respectively). However, it is also possible to simply dispose two clock generation circuits 1 of FIG. 4 so that the same driving can be realized. In each channel, the length of the ON interval of the high-side transistor is controlled based on the feedback voltage $V_{FB}$ corresponding to the output voltage $V_{OUT}$.

In addition, it is also possible to dispose three or more sets of the fixed duty ratio generation unit 40 and the FF 18 in the clock generation circuit, so as to generate three or more output clocks having different duty ratios. By applying this to a multiphase DC/DC converter, it is possible to generate output voltages ($V_{OUT}$) from four or more output stage circuits driven at different phases.

Eighth Example

Figure 18A:
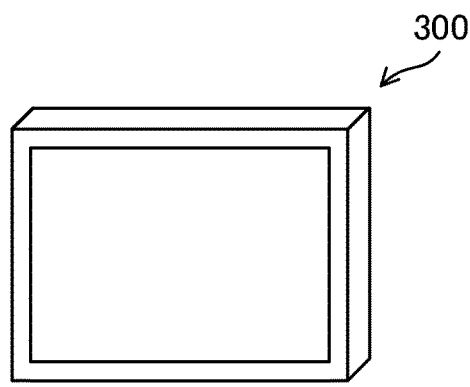
FIGS. 18A and 18B are an external view and a schematic structural block diagram of a car navigation device according to an eighth example of the present invention.
Figure 18B:
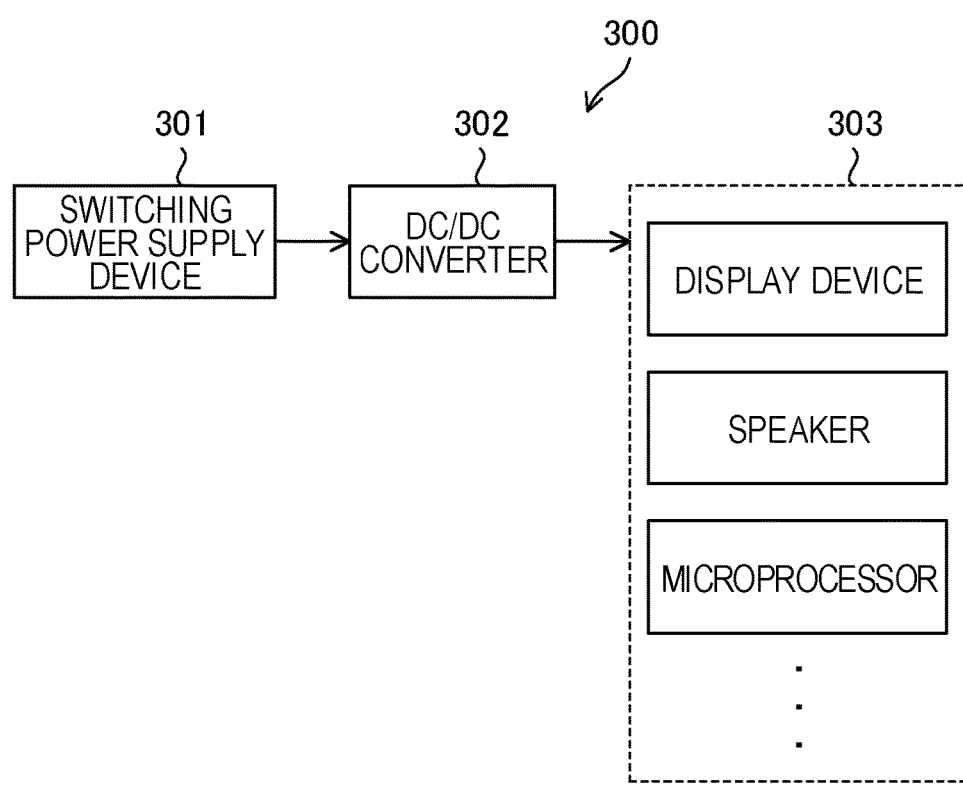

An eighth example is described. FIG. 18A is an external view of a car navigation device 300 according to an eighth example, and FIG. 18B is a schematic structural block diagram of the car navigation device 300. The car navigation device 300 includes a switching power supply device 301, a DC/DC converter 302, and a function block 303. As the switching power supply device 301, it is possible to use an arbitrary one of the switching power supply devices described above, including the switching power supply devices 100 and 150 of FIGS. 12 and 14. The input voltage of the switching power supply device 301 may be supplied from a battery disposed in a vehicle in which the car navigation device 300 is mounted. The DC/DC converter 302 converts the output voltage of the switching power supply device 301 into one or more DC voltages having desired voltage values and supplies the obtained DC voltages to the function block 303. The function block 303 operates by the DC voltages supplied from the DC/DC converter 302. The function block 303 includes a plurality of structural elements for realizing functions of the car navigation device 300, and includes a display device, a speaker, a microprocessor, and the like. Note that the output voltage of the switching power supply device 301 may be directly supplied to the function block 303.

In automotive applications, in order to satisfy noise performance, the switching frequency of the switching power supply device may be designated by the vehicle side in many cases. This designation is realized when supplying the external clock, and in this case, it is required to set the duty ratio of the output clock to a desired duty ratio regardless of the duty ratio of the external clock. The clock generation circuit and the switching power supply device according to the present invention can support this requirement.

In the car navigation device 300, it is considered that the DC/DC converter 302 and the function block 303 are loads to the switching power supply device 301. As a matter of course, the switching power supply device 301 may be mounted in an arbitrary device including an arbitrary load, without limiting to the car navigation device. For instance, the switching power supply device 301 may be applied to a motor driver whose load is a motor or an LED driver whose load is a light emitting diode (LED).

In addition, the output clock of the clock generation circuit according to the present invention may be used for constituting a PWM output circuit that generates a PWM signal. It is possible to consider that the PWM control units 112 and 122 of FIG. 12 and the PWM control unit 152 of FIG. 14 belong to the PWM output circuit.

Ninth Example

A ninth example is described.

Figure 19:
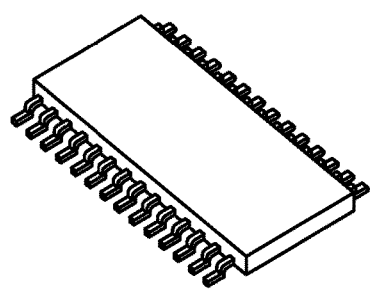
FIG. 19 is an external view of a semiconductor device according to a ninth example of the present invention.
Figure 20:
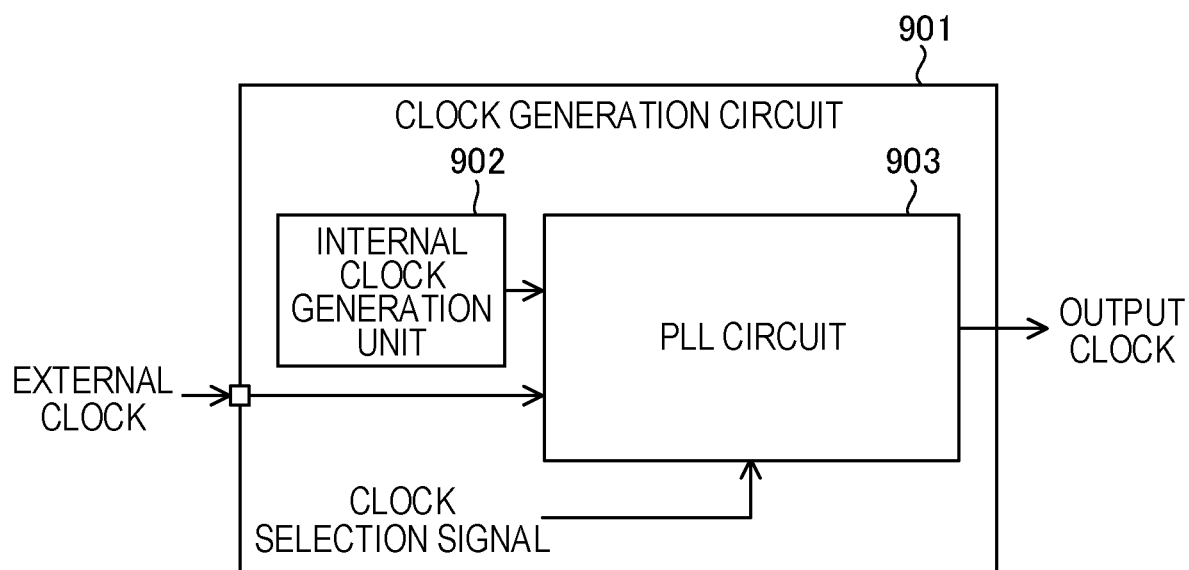
FIG. 20 is a structural diagram of a conventional clock generation circuit.

An arbitrary switching power supply device such as the switching power supply devices 100 and 150 of FIGS. 12 and 14 can be constituted using a semiconductor integrated circuit (hereinafter referred to as an IC). By encapsulating the semiconductor integrated circuit in a case (package) made of resin, a semiconductor device is constituted. An example of an external view of this semiconductor device is shown in FIG. 19. However, a part of structural elements of the switching power supply device may be discrete components disposed outside of the IC and are externally connected to the IC. For instance, in the structure of FIG. 12, the coil 113, the capacitor 114 and the voltage divider circuit 115 may be included as discrete components, and the output stage circuits 110 and 120 can also be included in the discrete components. In addition, for example, in the structure of FIG. 14, the coil 161, the coil 162, the capacitor 163, and the voltage divider circuit 164 can be included in the discrete component, and the output stage circuits 110 and 120 can also be included as the discrete components. Note that a single clock generation circuit can constitute the IC.

Concerning an arbitrary electronic apparatus equipped with an arbitrary switching power supply device such as the switching power supply devices 100 and 150 of FIGS. 12 and 14 and a processing unit, the following application can be considered. For instance, it is supposed that the processing unit is driven based on the output voltage of the switching power supply device. Just after the electronic apparatus is activated, the external clock is not supplied to the switching power supply device including the clock generation circuit, and the switching operation is performed by the output clock based on the internal clock. When the processing unit is activated using the output voltage generated by this switching operation, the processing unit itself or another circuit generating the external clock under control by the processing unit supplies the external clock to the switching power supply device including the clock generation circuit. After that, the switching operation is performed using the output clock based on the external clock.

Concerning an arbitrary signal or voltage, relationship between high level and low level of the signal or voltage may be inverted without losing the point described above.

<<Consideration of Present Invention>>

The structure of the present invention implemented in the embodiment described above is considered. It can be said that the clock generation circuit according to the present invention is capable of generating the output clock by using the external clock when the external clock is input, and by using the internal clock when the external clock is not input. Out of the external clock and the internal clock, the clock that is used for generating the output clock is referred to as a target clock for convenience sake.

A clock generation circuit W according to the present invention is a clock generation circuit capable of generating the output clock from the target clock by using the external clock as the target clock when the external clock is input. The clock generation circuit W includes a clock output circuit arranged to change level of the output clock from a first level to a second level in synchronization with a predetermined level change of the target clock (e.g. a change from low level to high level), a first ramp voltage generation circuit arranged to generate a first ramp voltage (Va) whose voltage value changes with a period of interval between neighboring predetermined level changes of the target clock, a second ramp voltage generation circuit arranged to generate a second ramp voltage (Vb) whose voltage value changes with a period of the interval, a comparison voltage holding circuit arranged to hold a comparison voltage (Vc) corresponding to the second ramp voltage when the predetermined level change occurs, and a comparator (14) arranged to compare the first ramp voltage with the comparison voltage. The clock output circuit changes the level of the output clock from the second level to the first level based on a comparison result of the comparator.

In this way, it is possible to generate the output clock that is synchronized with the external clock and has a desired duty ratio regardless of the duty ratio of the external clock. In this case, a PLL circuit is not necessary, and hence reduction of the circuit scale can be expected.

In the structure of FIG. 4, the FF 18 is an example of the clock output circuit. The predetermined level change is a change from low level to high level in each example described above, but it may be an opposite change. In the same manner, the level change of the output clock from first level to second level is a change from low level to high level in each example described above, but it may be an opposite change.

The first ramp voltage generation circuit is constituted to include the constant current circuit 11 and the capacitor C1 in the structure of FIG. 4, and it may further include the switch SW1.

The second ramp voltage generation circuit is constituted to include the constant current circuit I2 and the capacitor C2 in the structure of FIG. 4, and it may further include the switch SW2.

The comparison voltage holding circuit is constituted to include the capacitor C3 in the structure of FIG. 4, and it may further include the switch SW3.

The language "interval between neighboring predetermined level changes of the target clock" means an interval of one period of the target clock, and for example it corresponds to an interval from an up edge to the next up edge in the target clock (or it may correspond to an interval from a down edge to the next down edge in the target clock).

In other words, an example of the "interval between neighboring predetermined level changes of the target clock" is the interval between timing $T_{A1}$ and timing $T_{A5}$ in FIG. 7.

In the clock generation circuit W, for example, after the predetermined level change of the target clock (e.g. after timing $T_{A1}$, in response to a signal output from the comparator indicating that high and low relationship between the first ramp voltage and the comparison voltage is reversed (e.g. corresponding to an up edge of the signal CK_N1), the clock output circuit preferably changes a level of the output clock from the second level to the first level.

More specifically, for example, in the clock generation circuit W, the first ramp voltage generation circuit includes a first capacitor (C1) and a first constant current circuit (11) that supplies a first constant current to the first capacitor. In each period, when being supplied with the first constant current, the first ramp voltage generation circuit changes the terminal voltage of the first capacitor from a predetermined first initial voltage so as to generate the first ramp voltage (Va) from the terminal voltage of the first capacitor. The second ramp voltage generation circuit includes a second capacitor (C2) and a second constant current circuit (12) that supplies a second constant current to the second capacitor. In each period, when being supplied with the second constant current, the second ramp voltage generation circuit changes the terminal voltage of the second capacitor from a predetermined second initial voltage so as to generate the second ramp voltage (Vb) from the terminal voltage of the second capacitor. The comparison voltage holding circuit includes a third capacitor and holds a terminal voltage of the third capacitor as the comparison voltage in each period. A switch (SW2) is disposed between the second capacitor and the third capacitor. In response to the predetermined level change of the target clock, a part of stored charge of the second capacitor is supplied to the third capacitor via the switch, and hence the comparison voltage is preferably generated in the third capacitor.

Note that the first initial voltage is zero volts in each example described above, but the first initial voltage may be other than zero volts.

Further, specifically, for example, the following structure is preferred. The clock generation circuit W further includes a first pulse output circuit (16), which outputs a first pulse signal (a pulse signal of the micro time Δt1 contained in the signal CK_P2) in response to the predetermined level change of the target clock, and a second pulse output circuit (17), which outputs a second pulse signal (a pulse signal of the micro time Δt2 contained in the signal CK_N2) when receiving from the comparator a signal indicating that high and low relationship between the first ramp voltage and the comparison voltage is reversed, after the predetermined level change of the target clock. The first ramp voltage generation circuit is provided with a first capacitor discharge circuit (SW1) capable of discharging the first capacitor, and the comparison voltage holding circuit is provided with a third capacitor discharge circuit (SW3) capable of discharging the third capacitor. In response to the output of the first pulse signal, the first capacitor discharge circuit discharges the first capacitor, and when the switch is turned on, the second capacitor and the third capacitor are connected in parallel via the switch. In response to the output of the second pulse signal, the third capacitor discharge circuit discharges the third capacitor.

The embodiment of the present invention can be appropriately and variously modified within the scope of the technical concept defined in the claims. The embodiment described above is merely an example of the embodiment of the present invention, and meanings of the present invention and the structural elements are not limited to those described in the embodiment described above. Specific values described in the above description are merely examples, and they can be changed into various values as a matter of course.

What is claimed is:

1. A clock generation circuit comprising:
   an external clock input terminal to which an external clock is input or not input;
   an internal clock generation unit arranged to generate an internal clock, the clock generation circuit generating an output clock based on the external clock or the internal clock,
   wherein
   when the external clock is input to the external clock input terminal, regardless of a duty ratio of the external clock, a duty ratio of the output clock is set to a reference duty ratio,
   when the external clock is not input to the external clock input terminal, the output clock is generated to have a reference frequency and the reference duty ratio based on the internal clock, and
   when the external clock having a first frequency and a first duty ratio is input to the external clock input terminal, regardless of whether or not the first frequency is equal to the reference frequency and regardless of whether or not the first duty ratio is equal to the reference duty ratio, the output clock is generated to have the first frequency and the reference duty ratio based on the external clock.

2. The clock generation circuit according to claim 1, wherein
   when the external clock having a second frequency and a second duty ratio is input to the external clock input terminal, regardless of whether or not the second frequency is equal to the reference frequency and regardless of whether or not the second duty ratio is equal to the reference duty ratio, the output clock is generated to have the second frequency and the reference duty ratio based on the external clock,
   the first and second frequencies are different from each other, and
   the first and second duty ratios are different from each other.

3. The clock generation circuit according to claim 1, wherein
   when the external clock is input to the external clock input terminal, level of the output clock is changed from a first level to a second level in synchronization with a predetermined level change of the external clock and thereafter, based on a ramp voltage corresponding to the external clock, the level of the output clock is changed from the second level to the first level.

4. The clock generation circuit according to claim 1, wherein
   when the external clock is input to the external clock input terminal, the clock generation circuit uses the external clock as a target clock and generates the output clock from the target clock, and
   the clock generation circuit includes:
      a clock output circuit arranged to change level of the output clock from a first level to a second level in synchronization with a predetermined level change of the target clock; and
      a ramp voltage generation circuit arranged to generate a first ramp voltage and a second ramp voltage whose respective voltage values change with a period of interval between neighboring predetermined level changes of the target clock, and the clock output circuit changes the level of the output clock from the second level to the first level based on a signal corresponding to the first and second ramp voltages.

5. The clock generation circuit according to claim 4, wherein
   when the external clock is not input to the external clock input terminal, the internal clock is used as the target clock to generate the output clock.

6. A switching power supply device comprising the clock generation circuit according to claim 1, wherein
   the output clock generated by the clock generation circuit is used to switch an input voltage, thereby to generate an output voltage.

7. A switching power supply device according to claim 6, further comprising a plurality of output stage circuits arranged to switch the input voltage, wherein the plurality of output stage circuits are used to generate one or more output voltages, and the output clock is used to drive the plurality of output stage circuits at different phases.

* * * * *